US012777774B2

(12) United States Patent
Lee et al.

(10) Patent No.: US 12,777,774 B2
(45) Date of Patent: Oct. 27, 2026

(54) MASK-SUPPORT ASSEMBLY AND PRODUCING METHOD THEREOF

(71) Applicant: Olum Material Corporation, Yongin-si (KR)

(72) Inventors: Young Ho Lee, Yongin-si (KR); Hwi Su Kim, Yongin-si (KR); Dong Jin Lee, Osan-si (KR); Byung Il Lee, Seongnam-si (KR); Taek Yong Jang, Seongnam-si (KR); Jong Il Kim, Seongnam-si (KR)

(73) Assignee: Olum Material Corporation, Yongin-si (KR)

( * ) Notice: Subject to any disclaimer, the term of this patent is extended or adjusted under 35 U.S.C. 154(b) by 527 days.

(21) Appl. No.: 18/229,626

(22) Filed: Aug. 2, 2023

(65) Prior Publication Data

US 2024/0049506 A1 Feb. 8, 2024

(30) Foreign Application Priority Data

| | | |
|---|---|---|
| Aug. 5, 2022 | (KR) | 10-2022-0097839 |
| Sep. 19, 2022 | (KR) | 10-2022-0118103 |
| Nov. 29, 2022 | (KR) | 10-2022-0163155 |
| Jan. 27, 2023 | (KR) | 10-2023-0011042 |
| Jan. 31, 2023 | (KR) | 10-2023-0012920 |

(51) Int. Cl.

| | |
|---|---|
| ***H10K 59/12*** | (2023.01) |
| ***G03F 1/60*** | (2012.01) |
| ***G03F 7/00*** | (2006.01) |
| ***G03F 7/09*** | (2006.01) |
| ***H10K 59/131*** | (2023.01) |

(52) U.S. Cl.

CPC .......... *H10K 59/1201* (2023.02); *G03F 1/60* (2013.01); *G03F 7/09* (2013.01); *G03F 7/70683* (2013.01); *G03F 7/70833* (2013.01); *H10K 59/131* (2023.02)

(58) Field of Classification Search

CPC .... H10K 59/1201; H10K 59/131; G03F 1/60; G03F 7/09; G03F 7/70683; G03F 7/70833

USPC .......................... 257/40, 59, 88, 91, 99, 100

See application file for complete search history.

(56) References Cited

U.S. PATENT DOCUMENTS

2005/0211981 A1* 9/2005 Yotsuya ................ C23C 14/042 257/E23.179
2011/0067630 A1* 3/2011 Ko ........................ C23C 14/042 118/721
2016/0141498 A1* 5/2016 Ghosh .................. C23C 14/042 438/34

(Continued)

FOREIGN PATENT DOCUMENTS

KR 10-2011-0135552 12/2011
KR 10-2016-0061568 6/2016

(Continued)

*Primary Examiner* — Eric W Jones

(57) ABSTRACT

The present invention relates to a mask-support assembly and a producing method thereof. The mask-support assembly according to the present invention may include: a support comprising an edge portion and a grid portion; and a mask connected onto the support and comprising a plurality of cell portions in each of which a mask pattern is formed, wherein at least a partial region of the support is exposed on one surface of the support except for a region where the cell portions of the mask are disposed.

11 Claims, 16 Drawing Sheets

(56) References Cited

U.S. PATENT DOCUMENTS

| | | | | |
|---|---|---|---|---|
| 2017/0369983 | A1* | 12/2017 | Yi | C23C 14/185 |
| 2019/0378984 | A1* | 12/2019 | Nakamura | C23C 14/042 |
| 2020/0044010 | A1* | 2/2020 | Ju | C23C 14/12 |
| 2021/0140030 | A1* | 5/2021 | Jang | C23C 14/12 |
| 2021/0277512 | A1 | 9/2021 | Kim et al. | |
| 2022/0042159 | A1 | 2/2022 | Cho | |

FOREIGN PATENT DOCUMENTS

| | | |
|---|---|---|
| KR | 10-2019-0031851 | 3/2019 |
| KR | 10-2019-0090177 | 8/2019 |
| KR | 10-2020-0006351 | 1/2020 |
| KR | 10-2020-0040644 | 4/2020 |
| KR | 10-2020-0061277 | 6/2020 |
| KR | 10-2020-0080205 | 7/2020 |
| KR | 10-2020-0137592 | 12/2020 |
| KR | 10-2021-0064997 | 6/2021 |
| KR | 10-2021-0091103 | 7/2021 |
| KR | 10-2021-0113526 | 9/2021 |
| KR | 10-2022-0019881 | 2/2022 |
| KR | 10-2022-0027353 | 3/2022 |

* cited by examiner (a)

(b)

MASK-SUPPORT ASSEMBLY AND PRODUCING METHOD THEREOF

CROSS-REFERENCE TO RELATED APPLICATION(S)

This application claims the benefit under 35 USC § 119(a) of Korean Patent Application No. 10-2022-0097839, filed on Aug. 5, 2022, No. 10-2022-0118103, filed on Sep. 19, 2022, No. 10-2022-0163155, filed on Nov. 29, 2022, No. 10-2023-0011042, filed on Jan. 27, 2023, No. 10-2023-0012920, filed on Jan. 31, 2023, in the Korean Intellectual Property Office, the entire disclosure of which is incorporated herein by reference for all purposes.

BACKGROUND

1. Field

The following description relates to a mask-support assembly and a producing method thereof. More specifically, the following description relates to a mask-support assembly that is used in forming pixels on a semiconductor wafer and enables a mask pattern of ultra-high resolution to be precisely formed, and a producing method thereof.

2. Description of Related Art

As a pixel deposition technique in an organic light-emitting diode (OLED) manufacturing process, a fine metal mask (FMM) scheme for positioning a thin metal mask (or a shadow mask) in contact with or very close to a substrate and depositing an organic material at desired locations is commonly used.

In a conventional OLED manufacturing process, after a mask thin film is prepared, a mask is welded and fixed to an OLED pixel deposition frame and then is used. In the fixing process, there is a problem in that the mask of a large area is not well aligned. Also, in the process of welding and fixing the mask to the frame, there is a problem in that the mask sags or twists with the load since the mask film is too thin and has a large area.

In an ultra-high-resolution OLED manufacturing process, small defects of several μm may lead to pixel deposition failure, and thus there is a need to develop technology that is capable of preventing deformation of a mask, such as sagging or twisting of a mask, and clearly aligning the mask.

Recently, a microdisplay which is applied to a virtual reality (VR) device has drawn attention. A microdisplay is required to provide a much smaller screen size than those of the existing displays and still realize high quality within the small screen in order to display an image directly in front of a user's eye in a VR device. Therefore, smaller mask patterns than those of a mask used in the existing ultra-high-resolution OLED manufacturing process and a finer alignment of the mask before a pixel deposition process are required.

SUMMARY

Therefore, the present invention is devised to solve the above-mentioned problems of the related art and provides a mask-support assembly capable of realizing ultra-high definition pixels of a microdisplay, and a producing method thereof.

Moreover, an object of the present invention is to provide a mask-support assembly capable of enhancing stability of pixel deposition by allowing a mask to be clearly aligned, and a producing method thereof.

In addition, another object of the present invention is to provide a mask-support assembly providing a uniform stress level over the whole surface of a mask and a producing method thereof.

However, these objects are merely illustrative, and the scope of the present invention is not limited thereto.

The present invention provides a mask-support assembly which is used in a process of forming organic light-emitting diode (OLED) pixels on a semiconductor wafer, the mask-support assembly including a support including an edge portion and a grid portion; and a mask connected onto the support and including a plurality of cell portions in each of which a mask pattern is formed, wherein at least a partial region of the support is exposed on one surface of the support except for a region where the cell portions of the mask are disposed.

An edge of the support may have a circular shape.

The support and the mask may be connected through a connection portion interposed therebetween, and the connection portion may include at least one of Ni, Cu, Ti, Au, Ag, Al, Sn, In, Bi, Zn, Sb, Ge, or Cd.

At least a region that corresponds to the edge portion of the support may be exposed.

The grid portion may include a plurality of first grid portions extending in a first direction and having both ends connected to the edge portion; and a plurality of second grid portions extending in a second direction perpendicular to the first direction, intersecting with the first grid portions, and having both ends connected to the edge portion.

The mask may include the plurality of cell portions; separation portions disposed between the plurality of cell portions; and an outer peripheral portion disposed on an outer edge of the plurality of cell portions.

A region of the support that corresponds to a region outside the outer peripheral portion of the mask may be exposed.

The cell portions may have a rectangular shape, and the separation portions and the outer peripheral portion may be formed along the first direction and the second direction perpendicular to the first direction.

A width of the outer peripheral portion may be wider than that of the separation portions.

The mask includes a first mask layer and a second mask layer formed of a material different from that of the first mask layer, the first mask layer may be made of a material including at least one of Ni, Cu, Ti, Au, Ag, Al, Co, Ti, Cr, W, or Mo, and the second mask layer may be made of Invar or Super Invar.

The support may be formed from a silicon wafer, and the mask may be formed on the silicon wafer by electroforming.

The surface resistance of the support may be $5\times10^{-4}$ to $1\times10^{-2}$ ohm·cm.

A crystal orientation of a (100) plane or (111) plane of the silicon wafer may not be parallel to a formation direction of the grid portion.

The mask may include the plurality of cell portions; and an outer peripheral portion disposed on an outer edge of the plurality of cell portions, and slit lines may be formed between each cell portion so that the cell portions may be spaced apart from each other.

The thickness of the grid portion may be thinner than that of the edge portion, the thickness of the edge portion may range from 500 μm to 1,000 μm, and the thickness of the grid portion may range from 50 μm to 200 μm.

Also, the present invention provides a producing method of a mask-support assembly which is used in a process of forming OLED pixels on a semiconductor wafer, the producing method including the steps of: (a) preparing a conductive substrate; (b) forming, on a first surface of the conductive substrate, a mask including a plurality of cell portions in each of which a mask pattern is formed; (c) performing heat treatment on the conductive substrate and the mask; and (d) forming a support including an edge portion and a grid portion by etching a second surface of the conductive substrate that is opposite to the first surface of the conductive substrate, wherein the producing method further includes, between the steps (b) and (c), or between the steps (c) and (d), exposing at least a partial region of the support on one surface of the support except for a region where the cell portions of the mask are disposed.

The step of exposing of the at least a partial region of the support on one surface of the support except for the region where the cell portions of the mask are disposed may include: (1) forming an insulating portion on the plurality of cell portions; and (2) exposing at least the partial region of the support by removing an exposed region of the mask where the insulating portion is not formed.

The producing method may further include, between the steps (a) and (b), forming a connection portion including at least one of Ni, Cu, Ti, Au, Ag, Al, Sn, In, Bi, Zn, Sb, Ge, or Cd.

The producing method may further include, between the steps (c) and (d), (c2): adhering a template onto the mask through a temporary adhering portion; and (c3) reducing a thickness of the conductive substrate to 50 μm to 200 μm on a second surface opposite to a first surface of the conductive substrate.

The producing method may further include, between the steps (c) and (d): (c2') adhering a template onto the mask through a temporary adhering portion; and (c3') reducing a thickness of a region where at least the grid portion is to be formed to 50 μm to 200 μm on a second surface opposite to a first surface of the conductive substrate.

Other features and aspects will be apparent from the following detailed description, the drawings, and the claims.

Figure 1:
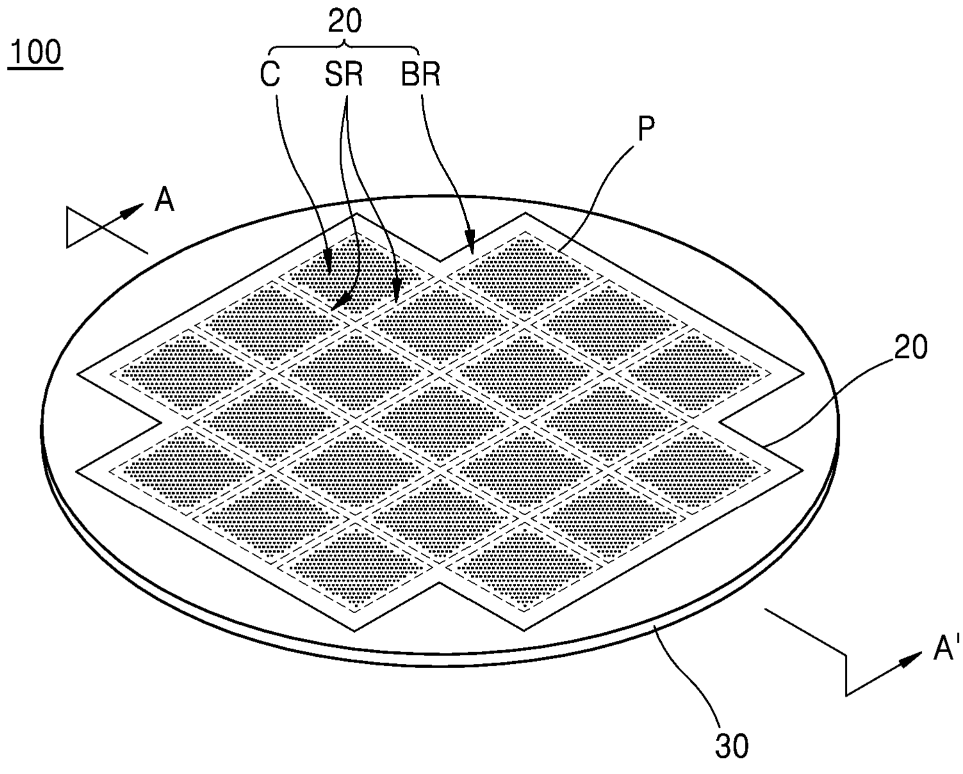
FIG. 1 is a schematic view of a mask-support assembly according to one embodiment of the present invention.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following detailed descriptions of the invention will be made with reference to the accompanying drawings illustrating specific embodiments of the invention by way of example. These embodiments will be described in detail such that the invention can be carried out by one of ordinary skill in the art. It should be understood that various embodiments of the invention are different, but are not necessarily mutually exclusive. For example, a specific shape, structure, and characteristic of an embodiment described herein may be implemented in another embodiment without departing from the scope of the invention. In addition, it should be understood that a position or placement of each component in each disclosed embodiment may be changed without departing from the scope of the invention. Accordingly, there is no intent to limit the invention to the following detailed descriptions. The scope of the invention is defined by the appended claims and encompasses all equivalents that fall within the scope of the appended claims. In the drawings, like reference numerals denote like functions, and the dimensions such as lengths, areas, and thicknesses of elements may be exaggerated for clarity.

Hereinafter, to allow one of ordinary skill in the art to easily carry out the invention, embodiments of the present invention will be described in detail with reference to the accompanying drawings.

Figure 2:
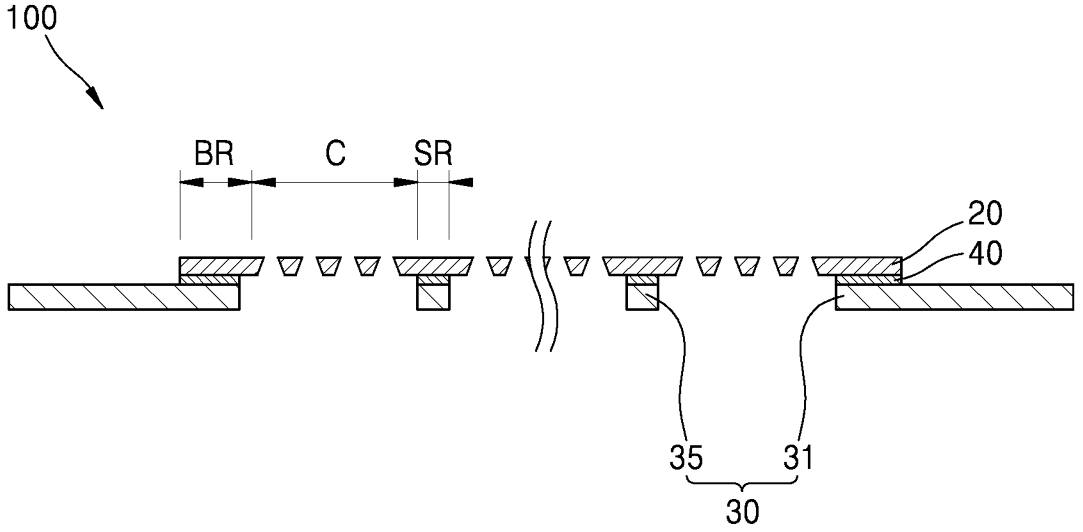
FIG. 2 is a schematic cross-sectional view taken along line A-A' of FIG. 1.
Figure 3:
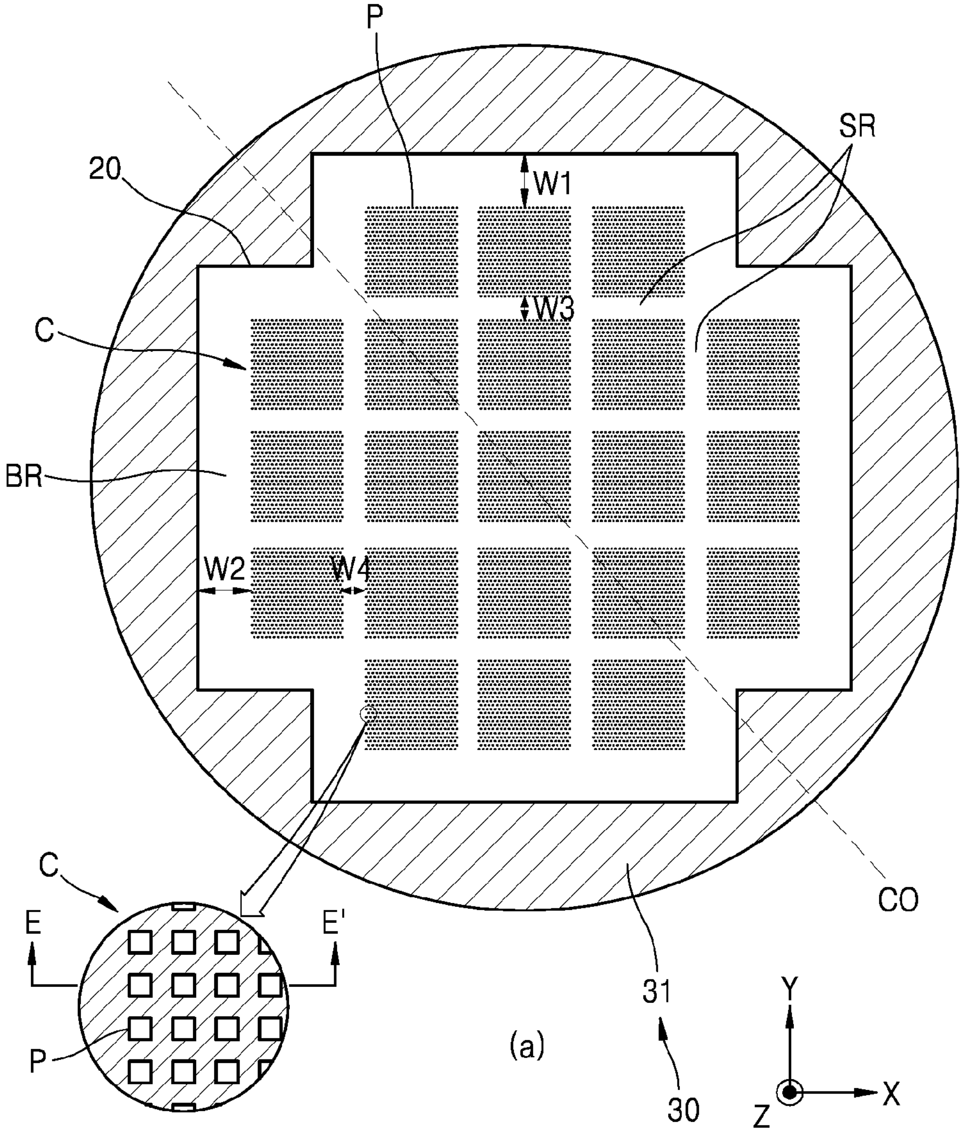
FIG. 3 is a schematic plan view and a schematic cross-sectional view taken along line E-E' showing a mask according to one embodiment of the present invention.
Figure 3:
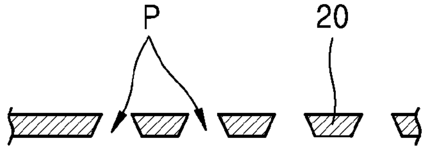
Figure 4:
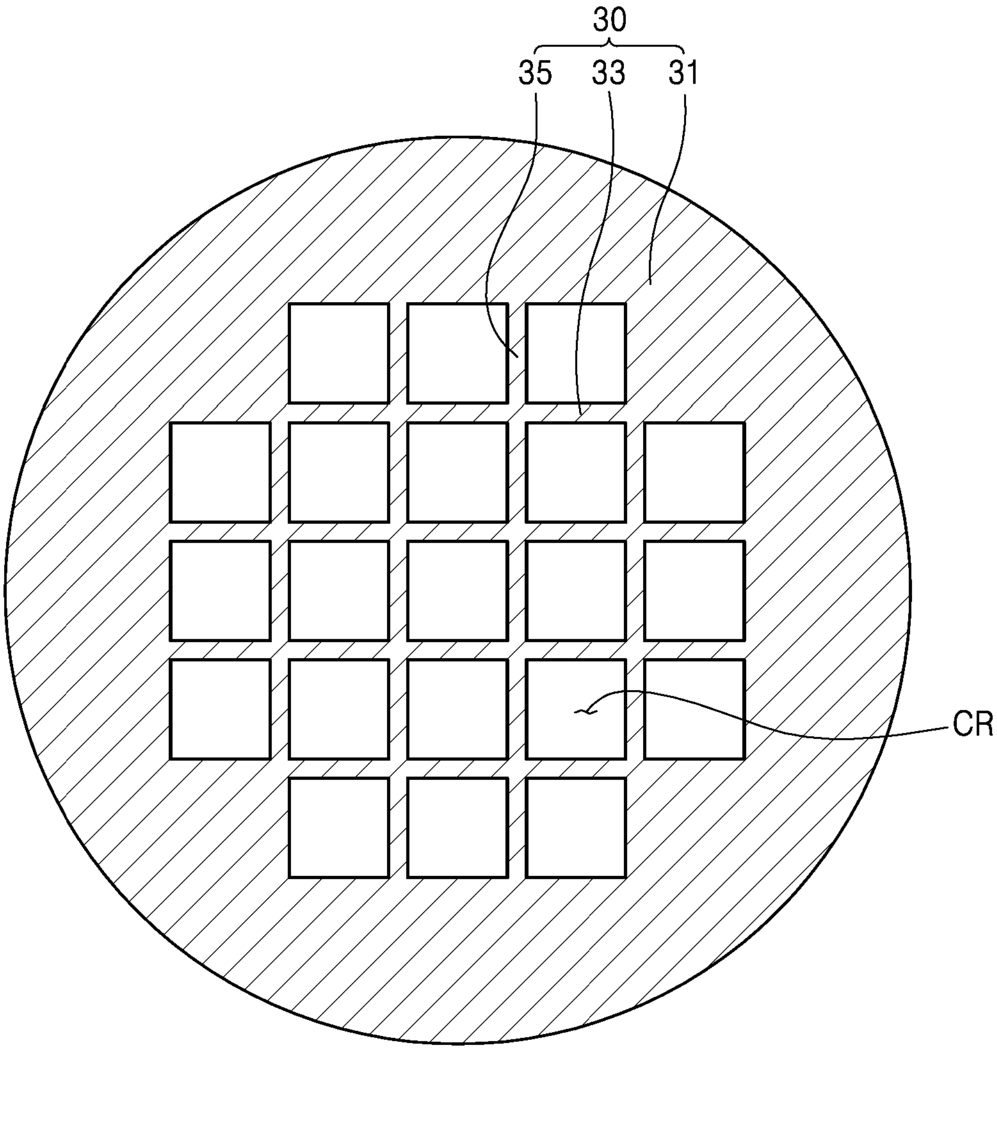
FIG. 4 is a schematic plan view showing a support according to one embodiment of the present invention.

FIG. 1 is a schematic view of a mask-support assembly 10 according to one embodiment of the present invention. FIG. 2 is a schematic cross-sectional view taken along line A-A' of FIG. 1. FIG. 3 is a schematic plan view and a schematic cross-sectional view taken along line E-E' showing a mask 20 according to one embodiment of the present invention. FIG. 4 is a schematic plan view showing a support 30 according to one embodiment of the present invention.

A microdisplay, which is recently applied to a virtual reality (VR) device, may be used in a pixel deposition process for a target substrate 1900 (see FIG. 18), such as a silicon wafer or a silicon wafer, rather than for a substrate of a large area. The microdisplay has a screen that is about 1 to 2 inches smaller than the size of the large area substrate because a screen is positioned directly in front of an eye of a user. Moreover, implementation of higher resolution is required since the screen is positioned closely in front of the eye of the user. Moreover, implementation of higher resolution is required since the screen is positioned closely in front of the eye of the user.

Accordingly, the present invention is directed to provide a mask-support assembly 100 which, rather than being used in a pixel formation process for a target substrate of a large area with a side length exceeding 1,000 mm, allows for a pixel formation process on a semiconductor silicon target wafer 1900 of 200 mm, 300 mm, or 450 mm such that ultra-high-resolution pixels are formed, and a producing method thereof.

For example, currently, quad high definition (QHD) image quality is 500 to 600 pixels per inch (PPI), wherein a size of each pixel is approximately 30 to 50 μm, and a 4K ultra-high definition (UHD) or 8K UHD image quality has a resolution of up to 860 PPI or up to 1,600 PPI, which is higher than the QHD image quality. A microdisplay directly applied to a VR device or a microdisplay inserted into a VR device is aimed at realizing ultra-high resolution of approximately 2,000 PPI or higher and has a pixel size of approximately 5 to 10 μm. In the case of a semiconductor wafer or a silicon waver, a finer and more precise process is possible compared to a glass substrate by utilizing technologies developed in a semiconductor process, and hence the semiconductor wafer or silicon wafer may be employed as a substrate of a high-resolution microdisplay. The present invention is characterized by a mask-support assembly 100 that allows for formation of pixels on the silicon wafer.

Figure 18:
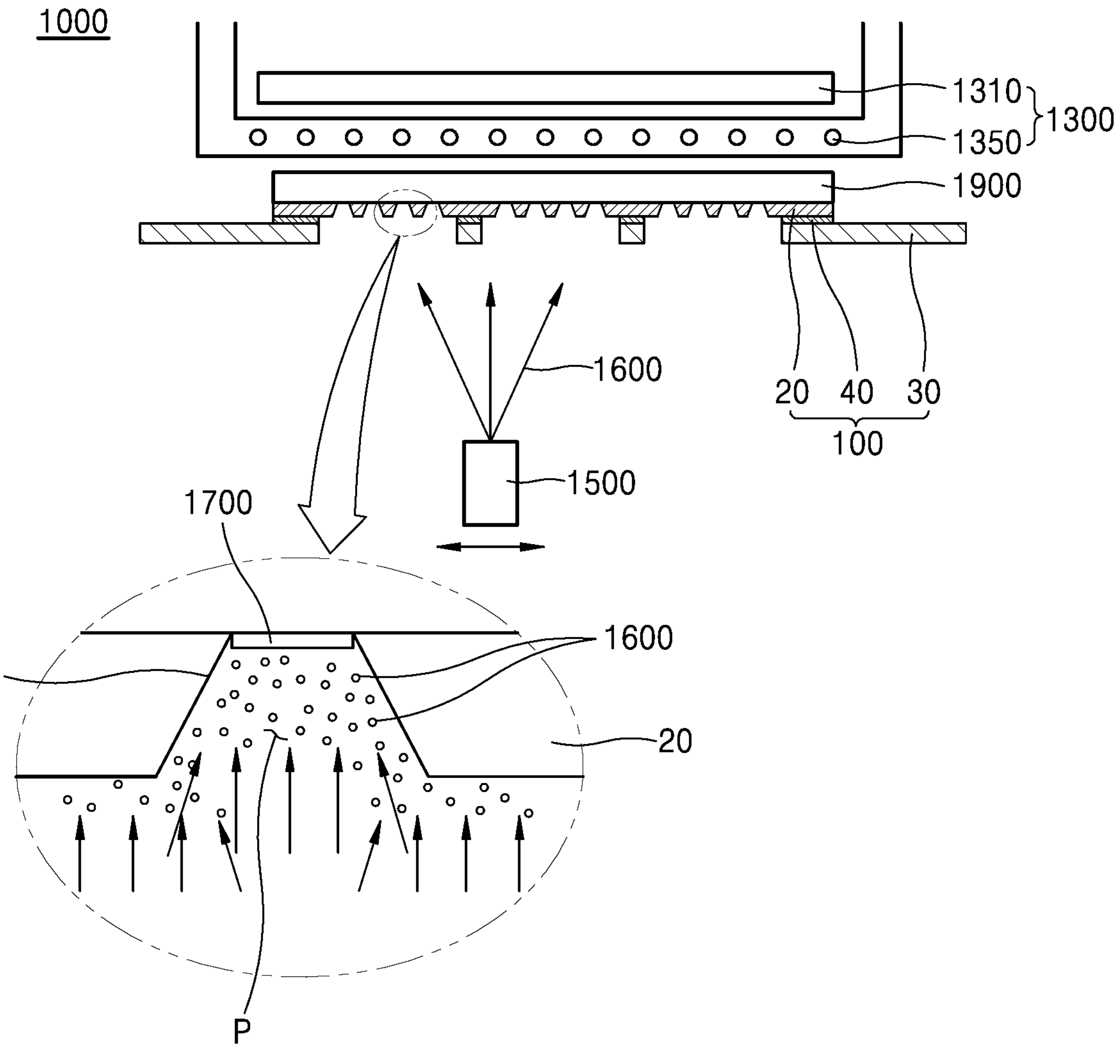
FIG. 18 is a schematic diagram of an organic light emitting diode (OLED) pixel deposition apparatus to which a mask-support assembly according to one embodiment of the present invention is applied.

Referring to FIGS. 1 and 2, the present invention is characterized in that a mask 20 has a shape corresponding to a semiconductor wafer (or a silicon wafer) in order to perform a pixel deposition process on the semiconductor wafer as a target substrate 1900 (see FIG. 18). When the shape of the mask 20 corresponds to the semiconductor wafer, it means that the mask 20 has the same shape and size as those of the semiconductor wafer or that the mask 20 has a different size and shape from the semiconductor wafer but is coaxial to the semiconductor wafer while mask patterns P are disposed within the shape of the semiconductor wafer. In addition, the mask 20 that has a shape corresponding to the semiconductor wafer is characterized in that it is integrally connected to the support 30 and is thereby clearly aligned.

The mask-support assembly 100 may include the mask 20 and the support 30. The mask 20 may be connected onto one surface of the support 30. The support 30 may serve as a frame that supports the mask 20.

Referring to FIGS. 1 to 3, the mask 20 may include cell portions C, separation portions SR, and an outer peripheral portion BR. The cell portions C are each a portion of the mask 20 that is not in contact with the support 30 and where the mask patterns P are formed, separation portions SR are disposed between the cell portions C, and the outer peripheral portion BR is an outer edge portion of the cell portions C and adhered to the support 30. Although the cell portion C, the separation portion SR, and the outer peripheral portion BR may be denoted by different names and reference characters according to the formed positions thereof, the cell portion C, the separation portion SR, and the outer peripheral portion BR are not separated regions and are configured to be integrally formed with the same material. In other words, the cell portion C, the separation portion SR, and the outer peripheral portion BR are each part of the mask 20 simultaneously formed in an electroforming process. Hereinafter, the cell portion C, the separation portion SR, and the outer peripheral portion BR may be used interchangeably with the mask 20.

The mask 20 preferably includes an Invar or Super Invar material. Alternatively, the mask 20 may include a material available for electroforming, such as nickel (Ni), copper (Cu), gold (Au), silver (Ag), aluminum (Al), cobalt (Co), titanium (Ti), chromium (Cr), tungsten (W), molybdenum (Mo), or the like. Alternatively, the mask 20 may include a metal material capable of forming a silicide with silicon of the support 30. Alternatively, the mask 20 may include a Super Invar material containing a tertiary or higher Co. The mask 20 may have a circular shape to correspond to a circular semiconductor wafer. The mask 20 may have a size equal to or greater than the size of a silicon wafer of 200 mm, 300 mm, 450 mm, or the like.

A conventional mask has a shape of rectangle, polygon, or the like to correspond to a large area substrate. In addition, a frame also has a shape of rectangle, polygon, or the like to correspond to the mask. Since the mask has angled corners, there may be a problem in that stress is concentrated on the corners of the mask. Concentration of stress may cause different force to act on only a portion of the mask, which may twist or distort the mask, leading to a failure of pixel alignment. In particular, at an ultra-high resolution of 2,000 PPI or higher, stress concentration on the corners of the mask should be avoided.

Therefore, as will be described below, the mask 20 of the present invention has a circular shape in the process of forming on the support 30 and thus has no corners. That is, a dummy portion DM (see FIG. 6) of the mask 20 may have a circular shape and have no corners. Since there is no corner, it is possible to solve the problem that different force acts on a specific portion of the mask 20, and the stress may be uniformly distributed along a circular edge. Accordingly, the mask 20 may contribute to clear pixel alignment without being twisted or distorted, and mask patterns P of 2,000 PPI or higher may be realized. The mask 20 may be formed such that the edges of the mask 20 and the support 30 match with each other or the mask 20 surrounds the sides of the edge of the support 30 after the mask 20 is formed.

A plurality of mask patterns P may be formed in the cell portion C. The mask patterns P are a plurality of pixel patterns P that correspond to red (R), green (G), and blue (B) pixels. Sides of each mask pattern P may have a sloped shape, a tapered shape, or a shape in which a pattern width gradually increases from the upper portion toward the lower portion. A number of mask patterns P may be grouped to form a single display cell portion C. The display cell portion C may have a diagonal length of approximately 1 to 2 inches, and may be a portion that corresponds to one display. Alternatively, the display cell portion C may be a portion that corresponds to a plurality of displays.

The mask pattern P may have a substantially tapered shape, and may have a pattern width of several to several tens of μm, preferably of approximately 5 to 10 μm (resolution of 2,000 PPI or higher).

The mask 20 may include a plurality of cell portions C. The cell portion C may have a rectangular shape. The plurality of cell portions C may be arranged at predetermined intervals in a first direction (x-axis direction) and in a second direction (y-axis direction) that is perpendicular to the first direction. In FIG. 1, it is shown that 21 cell portions C are arranged along the first and second directions, but the present invention is not limited thereto. The separation portion SR may be disposed between the cell portions C. The outer peripheral portion BR may be disposed on the outer edge of the plurality of cell portions and the plurality of separation portion SR to surround the outer edge of the plurality of cell portions C and the separation portions SR.

The plurality of cell portions C may be arranged along the first and second directions (X- and Y-axis directions). Corresponding to this arrangement, the separation portions SR may extend along the first and second directions (x- and y-axis directions). The outer peripheral portion BR may extend along the first and second directions (x- and y-axis directions) like the separation portions SR. Since the outer peripheral portion BR is the outer edge of the plurality of cell portions C and the separation portions SR, it may be provided in the shape of a plus (+) sign, or cross, as a whole.

The widths W1 and W2 of the outer peripheral portion BR may be greater than the widths of grid portions 33 and 35. For example, the widths W1 and W2 of the outer peripheral portion BR may be approximately 7 to 10 mm, and the widths W3 and W4 of the grid portions 33 and 35 may be approximately 1 to 5 mm. Since the outer peripheral portion BR has wider widths W1 and W2, the edge portion of the mask 20 may be more stably adhered onto the support 30. Meanwhile, the widths W1 and W2 of the outer peripheral portion BR may be equal to the widths W3 and W4 of the grid portions 33 and 35 as long as the mask 20 can be stably adhered onto the support 30.

Referring to FIGS. 1, 2, and 4, the support 30 may include an edge portion 31, a plurality of first grid portions 33, and a plurality of second portions 35. Although the edge portion 31 and the first and second grid portions 33 and 35 may be denoted by different names and reference characters, the edge portion 31 and the first and second grid portions 33 and 35 are not separated regions and are configured to be integrally formed with the same material. Hereinafter, the edge portion 31 and the first and second grid portions 33 and 35 may be used interchangeably with the support 30.

The support 30 is preferably made of a silicon material, and more preferably, the support 30 may be formed from a silicon wafer and made of a monocrystalline silicon material. The support 30 may have a circular edge to correspond to a circular semiconductor wafer that is a target substrate 1900 (see FIG. 18). The support 30 may have a shape of the same size or at least larger than the mask 20 so that the mask 20 can be connected to an upper portion of the support 30.

The edge portion 31 may define the outer shape of the support 30. The edge portion 31 may have a circular shape. However, the edge portion 31 may have a different shape as long as electroforming of the mask 20 can be easily performed and the support 30 corresponds to a semiconductor wafer, enabling an organic light-emitting diode (OLED) pixel process.

The plurality of first grid portions 33 may extend in the first direction and may each have both ends connected to the edge portion 31. In addition, the plurality of second grid portions 35 may extend in the second direction perpendicular to the first direction, intersecting with the first grid portions 33, and may each have both ends connected to the edge portion 31. The first grid portions 33 may be arranged in parallel with each other at predetermined intervals, and the second grid portions 35 may be arranged in parallel with each other at predetermined intervals. Also, since the first and second grid portions 33 and 35 intersect with each other, empty regions CR, in the form of a matrix, may appear at the intersecting portions. These empty regions CR where the cell portions C of the mask 20 are disposed are referred to as "cell regions CR" (see FIG. 4).

The thickness of the support 30 may be greater than the thickness of the mask 20. In order to realize mask patterns P of 2,000 PPI or higher, the thickness of the mask 20 may be approximately 2 μm to 12 μm. If the mask 20 is thicker than the aforementioned thickness, it may be difficult to form the mask patterns P, having an overall tapered shape, to have the width or spacing that meets the desired resolution. The support 30 may be formed to have a thickness of approximately 50 μm to 200 μm such that it has sufficient rigidity to support the mask 20 and can be tensioned on a cell portion-by-cell portion basis.

Meanwhile, a connection portion 40 may be interposed between the mask 20 and the support 30. The mask 20 may be connected onto the support 30 with the connection portion 40 interposed between them. The outer peripheral portion BR of the mask 20 may be connected and supported on the edge portion 31 of the support 30, and the separation portions SR of the mask 20 may be connected and supported on the first and second grid portions 33 and 35 of the support 30.

The connection portion 40 may serve as an adhesion layer that mediates adhesion such that the mask 20 is formed with a higher adhesive strength on the support 30. For example, in the case where the support 30 is a silicon wafer, the adhesive strength of the mask 20 is higher when the mask 20, which is made of Invar or Super Invar, is adhered to the support 30 through the connection portion 40 made of Ni, Cu, or the like, than when the mask 20 is directly adhered to the support 30. Taking this into account, the connection portion 40 may contain at least one of Ni, Cu, Ti, Au, Ag, Al, Sn, In, Bi, Zn, Sb, Ge, or Cd.

Meanwhile, the connection portion 40 may be formed by thermal treatment H (see FIG. 12) in a state of a laminate in which the mask 20 is formed onto the support 30. In this case, the connection portion 40 may be provided as an intermetallic compound in which the component of the mask 20 and the component of the support 30 are combined. As the Fe and Ni components of the mask 20 and the Si component of the support 30 are combined, the connection portion 40 may contain Ni and Si, or Fe, Ni, and Si, or may be provided as a silicide containing Fe and Ni. By the bond strength of the intermetallic compound, the mask 20 and the support 30 may be attached to each other with the connection portion 40 interposed therebetween.

Referring back to FIG. 3, a crystal orientation (CO) of the (100) or (111) plane of the silicon wafer may not be parallel to the longitudinal directions of the grid portions 33 and 35. The grid portions 33 and 35 may extend along the x-axis direction or the y-axis direction, and the crystal orientation CO of the (100) or (111) plane of the silicon wafer of the support 30 may not be parallel to the x-/y-axis direction (at an angle of 0°) and may have a predetermined angle other than 0° with respect to the x-/y-axis direction. In another aspect, the crystal orientation CO of the (100) or (111) plane of the silicon wafer may have a predetermined angle with respect to the x-/y-axis direction in which the plurality of cell portions C are disposed. The silicon wafer is more likely to be broken in the crystal orientation CO of the (100) or (111) plane than in other crystal orientations. As the cell portions C, the separation portions SR, and the like of the mask 20 that correspond to the grid portions 33 and 35 are arranged in a staggered manner in the crystal orientation CO, the risk of breakage of the mask-support assembly 100 is reduced and overall rigidity is increased.

Referring back to FIGS. 1 to 3, the mask-support assembly 100 of the present invention is characterized in that, on one surface (upper surface) of the support 30, at least a partial region of the support 30 is exposed except for the region where the cell portions C of the mask 20 are disposed. In another aspect, the support 30 may be exposed except for regions covered by the cell portions C, the separation portions SR, and the outer peripheral portion BR of the mask 20. The exposed region of the support 30 may correspond to the edge portion 31 excluding the grid portions 33 and 35. Alternatively, the exposed region of the support 30 may correspond to a region that corresponds to the portion outside the outer peripheral portion BR of the mask 20.

As will be described below, the mask 20 may be formed over the entire upper surface of the support 30 in the process of electroforming the mask 20 on the support 30. In this case, the mask 20 may be formed to include the dummy portion DM in addition to the cell portions C, the separation portions SR, and the outer peripheral portion BR. However, when heat treatment H is performed in a state in which the mask 20 is electroformed over the entire upper surface of the support 30 (see FIG. 12), the amount of shrinkage of the mask 20 may be greater than that of the support 30 made of silicon during the process of raising and lowering the temperature of the mask 20. The amount of shrinkage of the mask 20 greater than that of the support 30 may act as a tensile force that pulls the support 30 inward, causing warpage, deformation, or the like of the support 30. The tensile force acting on the support 30 may cause a deformation such that the support 30 is curved at the central part like a saucer. The warpage or deformation of the support 30 may cause the mask 20 to be peeled off from the support 30, or cause the misalignment of the mask 20. For example, if the support 30 is warped by approximately 1 mm, an error of approximately 1 to 2 μm may occur in the pixel position accuracy (PPA) of the mask patterns P of the mask 20.

Therefore, according to the present invention, heat treatment H (see FIG. 12) is performed on the mask 20 whose at least the dummy portion DM is removed to expose a part of the edge portion 31 of the support 30 without covering the entire surface of the support 30 with the mask 20, so that the mask 20 can be adhered to the support 30 with good adhesion without deformation of the support 30.

FIGS. 5 to 16 are schematic views illustrating a producing process of a mask-support assembly according to one embodiment of the present invention.

Figure 5:
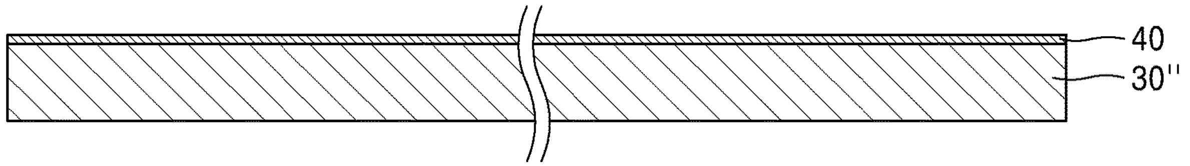
FIGS. 5 to 16 are schematic views illustrating a producing process of a mask-support assembly according to one embodiment of the present invention.

Referring to FIG. 5, a support 30" which is a conductive substrate 30" is prepared. The support 30" may be made of a conductive material to enable electroforming. To achieve conductivity and have low resistance, the support 30" may be highly doped at a concentration higher than or equal to $10^{19}$ $cm^{-3}$. The doping may be performed on the entire support 30" or only on the surface of the support 30". According to one embodiment, the surface resistance of the support 30" may be $5\times10^{-4}$ to $1\times10^{-2}$ ohm·cm. The support 30' may be used as a cathode in electroforming.

Unlike metals having metal oxide on the surface thereof and polycrystalline silicon having a grain boundary, doped monocrystalline silicon has no defects, and thus a uniform electroformed film (or a mask 20 or a connection portion 40) may be formed due to generation of a uniform electric field on a whole surface in an electroforming process. The mask 20 prepared through the uniform plated film may increase the resolution of OLED pixels. Moreover, since a process for removing or preventing defects is not additionally required, process costs may be reduced and productivity may be increased.

Then, a connection portion 40 may be formed on one surface of the conductive substrate 30" (or the support 30"). The connection portion 40 may be formed by electroforming. Alternatively, when the material of the connection portion 40 is not suitable for electroforming, the connection portion 40 may be formed using sputtering or brazing. The connection portion 40 may be formed of a material such as Ni, Cu, Ti, Au, Ag, Al, etc. That has high adhesion to the support 30 when produced by electroforming. Alternatively, the connection portion 40 may be formed of a material such as Sn, In, Bi, Zn, Sb, Ge, Cd. etc. That has high adhesion to the support 30 when produced by sputtering or brazing.

Since the connection portion 40 may serve to increase the adhesion between the support 30 and the mask 20 and to enable electroforming of the mask 20 on the connection portion 40, the connection portion 40 preferably has a thinner thickness than that of the mask 20. Taking this into account, it is preferable that the thickness of the connection portion 40 does not exceed 20% of the thickness of the mask 20.

Meanwhile, if the mask 20 and the support 30 can be adhered to each other with sufficient adhesion through heat treatment H which will be described below with reference to FIG. 12, the connection portion 40 may be omitted. In this case, an insulating portion M1 may be directly formed on the support 30, and the mask 20 may be electroformed.

Figure 6:
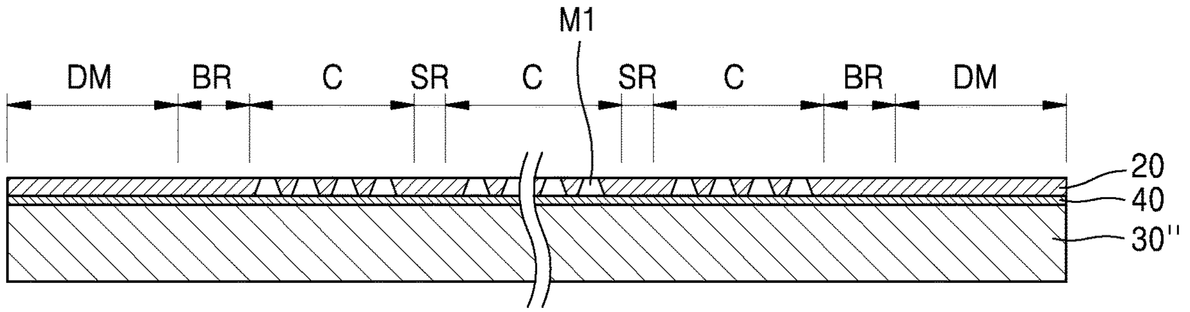

Next, referring to FIG. 6, a patterned insulating portion M1 may be formed on one surface of the connection portion 40. The insulating portion M1 is a part formed to protrude (embossed) from one surface of the connection portion 40, and may have insulation properties to prevent the formation of a plated film (or the mask 20). Accordingly, the insulating portion M1 may be made of at least one of a photoresist material, a silicon oxide material, or a silicon nitride material. The insulating portion M1 may be formed by forming a silicon oxide or a silicon nitride on the connection portion using deposition or the like. When the connection portion 40 is not formed, the insulating portion M1 may be formed by thermal oxidation or thermal nitridation using the support 30" as a base. A photoresist may be formed using a printing method or the like. The insulating portion M1 is preferably formed thicker than the plated film to be formed.

The insulating portion M1 preferably has a tapered shape. When a pattern in a tapered shape is formed using a photoresist, a multiple exposure method, a method of varying an exposure intensity per region, or the like may be used.

Then, a mask 20 may be formed by electroforming on the connection portion 40. The support 30" and the connection portion 40 are used as a cathode body and an anode body (not shown) facing the anode body is prepared. The anode body may be immersed in a plating solution (not shown), and the entire or a part of the support 30" and the connection portion 40 may be immersed in the plating solution. Since the insulating portion M1 has the insulating properties and thus a plated film is not formed on a region that corresponds to the insulating portion M1, the mask pattern P of the mask 20 may be constructed on the corresponding region. The mask pattern P (or the insulating portion M1) may be formed on a region that corresponds to the cell portion C.

The mask 20 may be formed to include a dummy portion DM in addition to cell portions C, separation portions SR, and an outer peripheral portion BR on one surface (upper surface) of the support 30". The dummy portion DM may be an area outside the outer peripheral portion BR, and may correspond to a region to be removed before or after heat treatment H. The dummy portion DM may be formed to cover the edge of the support 30", allowing the mask 20 to be stably adhered to and supported by the support 30" after the electroforming process.

Meanwhile, the composition of the mask 20 may be controlled so that the mask 20 has a coefficient of thermal expansion (CTE) similar to that of a silicon material of the support 30". In the mask-support assembly 100, the support 30 serves as a frame made of silicon, and the mask 20 should have a similar coefficient of thermal expansion to that of the support 30 so that the mask 20 does not sag on the support 30 which is a frame. In addition, the change in pixel position accuracy (PPA), which is misalignment of the cell portions C and the mask patterns P on the support 30, may be reduced.

Taking this into account, the composition of the mask 20 may be controlled so that the coefficient of thermal expansion of the support 30 made of silicon and the coefficient of thermal expansion of the mask 20 after heat treatment H which will be described below become approximately $(3.5\pm1)\times10^{-6}/°$ C. Even when the mask 20 is made of Invar, the coefficient of thermal expansion of the mask 20 may be controlled to be as close or similar as possible to the coefficient of thermal expansion of the support 30 made of silicon by electroforming with varying composition ratios of Fe and Ni. Alternatively, the coefficient of thermal expansion of the mask 20 may be controlled to be smaller or greater than that of the support 30 so that the mask 20 can be tightly connected onto the support 30 according to process temperature conditions.

Figure 7:
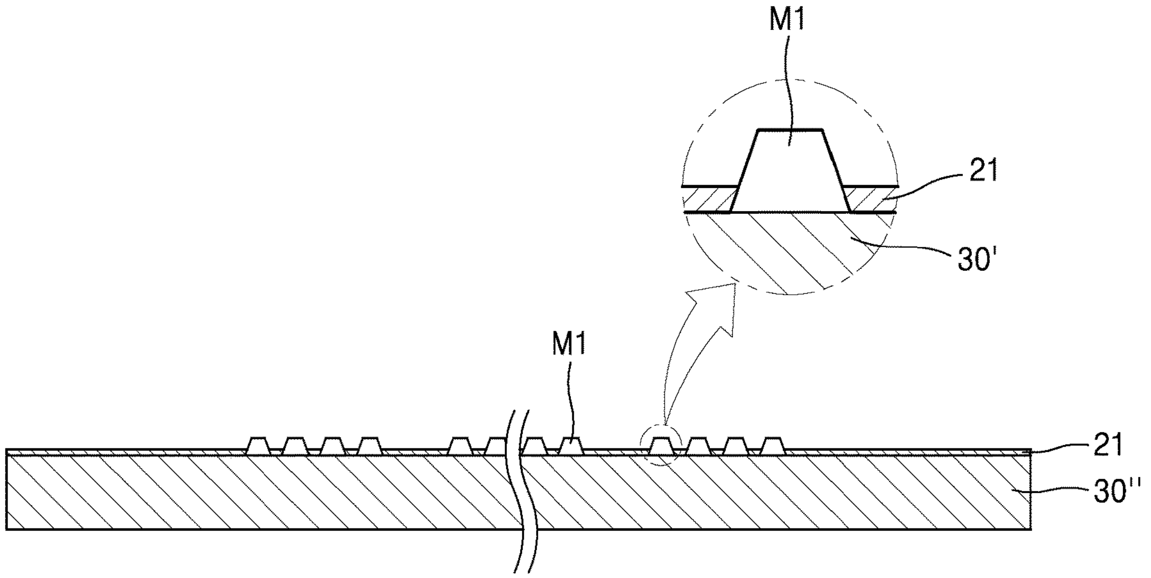
Figure 8:
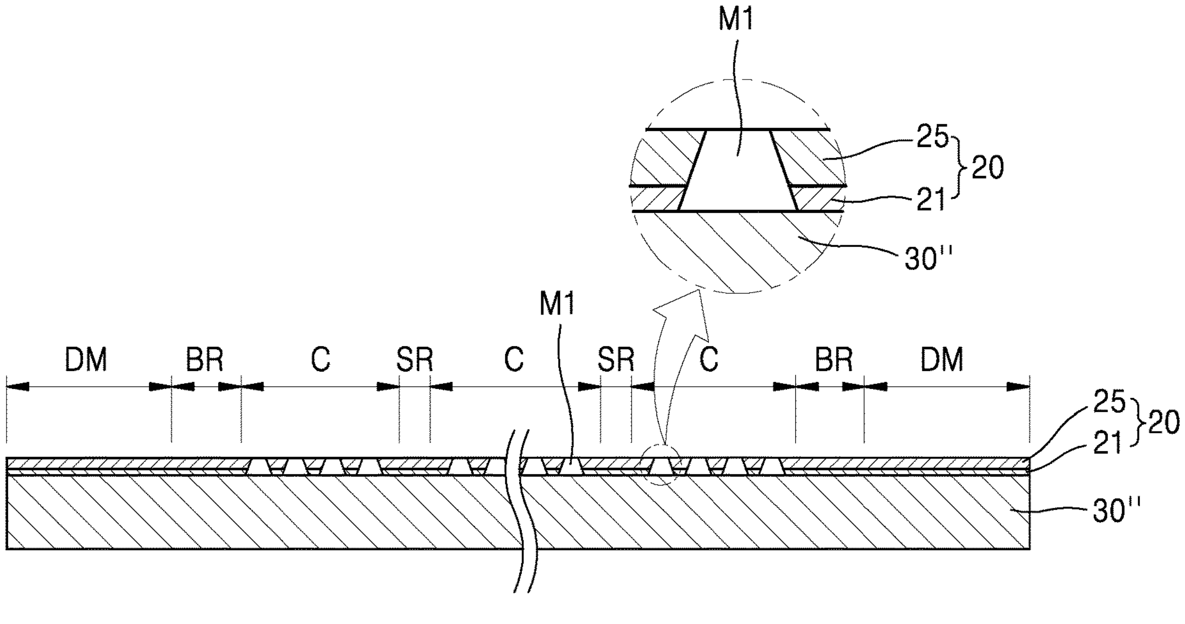

FIGS. 7 and 8 are schematic views illustrating a process of forming a mask 20 according to another embodiment.

If the connection portion 40 of FIG. 5 is made of a material suitable for electroforming, it may be replaced with a first mask layer 21 as shown in FIGS. 7 and 8.

First, referring to FIG. 7, a patterned insulating portion M1 may be formed on one surface of the support 30" (or the conductive substrate 30"). Then, the first mask layer 21 may e formed by electroforming on the conductive substrate 30". Since the insulating portion M1 has the insulating properties and thus a plated film is not formed on a region that corresponds to the insulating portion M1, a mask pattern P of the first mask layer 21 may be constructed on the corresponding region. The mask pattern P (or the insulating portion M1) may be formed on a region that corresponds to the cell portion C.

The first mask layer 21 may include any one of Ni, Cu, Au, Ag, Al, Co, Ti, Cr, W, or Mo that has high adhesion to the support 30" when produced by electroforming. Alternatively, the first mask layer 21 may be formed of a metal material capable of forming a silicide with the support 30". As will be described below, in the process of heat treatment H (see FIG. 12) of the mask 20 and the support 30", it is necessary to ensure that the mask 20 strongly adheres to the support 30" so as not to be peeled off therefrom. Therefore, the first mask layer 21 having stronger adhesion to the support 30" than the material of a second mask layer 25 may be first formed on the support 30". The first mask layer 21 may play the same role as the connection portion 40 of FIG. 5.

However, since the first mask layer 21 has high adhesion to the support 30", but may have a high coefficient of thermal expansion and low strength, the first mask layer 21 needs to be formed such that its thickness portion is smaller than that of the second mask layer 25 in the mask 20. Taking this into account, the first mask layer 21 may be formed with a thickness ranging from 0.01% to 5% of the thickness of the mask 20, and more preferably a thickness ranging from 0.03% to 2%.

Then, referring to FIG. 8, the second mask layer 25 may be formed by electroforming on the first mask layer 21. The second mask layer 25 may be made of a different material from that of the first mask layer 21. Since the first mask layer 21 is conductive and the insulating portion M1 has insulating properties, the second mask layer 25 may be formed on the first mask layer 21 and may include the mask pattern P. The second mask layer 25 may be made of a material, such as Invar, Super Invar, or the like, that has high adhesion to the first mask layer 21, a low coefficient of thermal expansion, and high strength, when produced by electroforming. In addition, the second mask layer 25 may be formed thicker than the first mask layer 21 so that the second mask layer 25 is mainly responsible for a coefficient of thermal expansion and strength in the mask 20. Taking this into account, the second mask layer 25 may be formed with a thickness ranging from 95% to 99.99% of the thickness of the mask 20, and more preferably a thickness ranging from 98% to 99.97%. For example, when the total thickness of the mask 20 is approximately 2 to 15 μm, the first mask layer 21 may be formed with a thickness of approximately 10 to 300 nm.

The mask 20 may be formed by sequentially stacking the first mask layer 21 and the second mask layer 25.

In addition, the thicknesses of the first and second mask layers 21 and 25 may be controlled such that the mask 20 has a coefficient of thermal expansion similar to that of the silicon material of the support 30'. As the first and second mask layers 21 and 25 have different coefficients of thermal expansion, the coefficient of thermal expansion of the mask 20 may vary according to the thickness ratio between the first and second mask layers 21 and 25. For example, as the proportion of the thickness of the first mask layer 21 having a relatively high coefficient of thermal expansion to the total thickness of the mask 20 increases, the coefficient of thermal expansion of the entire mask 20 may increase. On the contrary, as the proportion of the thickness of the second mask layer 25 having a relatively low coefficient of thermal expansion to the total thickness of the mask 20 increases, the coefficient of thermal expansion of the entire mask 20 may decrease. The proportions of the thickness of the first and second mask layers 21 and 25 may be controlled by adjusting the duration of electroforming.

Hereinafter, subsequent processes will be described assuming that a mask 20 is formed by electroforming after forming the connection portion 40 shown in FIGS. 5 and 6. However, the processes described hereinafter may be equally applied to the example of forming the mask 20 by sequentially stacking the first and second mask layers 21 and 25 on the support 30" shown in FIGS. 7 and 8.

Figure 9:
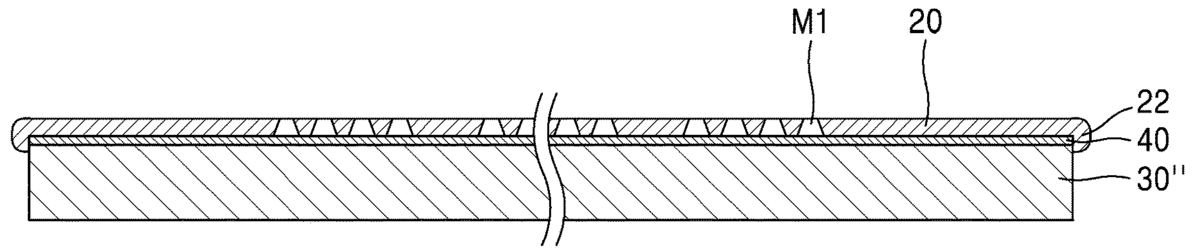

Referring to FIG. 9, electroforming may be performed such that the mask 20 is formed on the upper surface and the side surface of the support 30", rather than being formed only on the upper surface of the support 30". In the case of performing heat treatment H which will be described below, if the mask 20 is formed only on the upper surface of the support 30", there is a risk that the edge portion of the mask 20 will be peeled off during the heat treatment H process, and thus a plated film 22 may also be formed further on the side surface of the support 30". Accordingly, as the plated film 22 on the side surface of the support 30" reinforces the adhesion to the support 30", the entire mask 20 may not be peeled off during the heat treatment H process, and may be well fixed and adhered to the support 30. The plated film on the side surface may be removed later.

Also, in the case of performing heat treatment H which will be described below, the mask formed by electroforming needs to be well adhered to the support 30" without being peeled off. To this end, other approaches may be considered in addition to electroforming on the upper and side surfaces shown in FIG. 6.

In one approach, a native oxide of the support 30" on which electroforming is performed may be controlled. An oxide may be formed on the surface of the support 30" made of a silicon wafer. On the surface with such an oxide, a uniform electric field is not generated, and hence the electroformed film (the mask 20) may not be uniformly produced, and the adhesion between the produced plated film (the mask 20) and the support 30" may be low. Therefore, a process of removing the native oxide is preferably followed by an electroforming process.

In another approach, the surface of the support 30" may be pre-treated before electroforming. Through physical treatment or chemical treatment, the plated film (the mask 20) produced in the electroforming process may be formed on the support 30" with stronger adhesion. In addition, by controlling the plating method in the electroforming process, the plated film (the mask 20) may be formed on the support 30" with strong adhesion.

Figure 10:
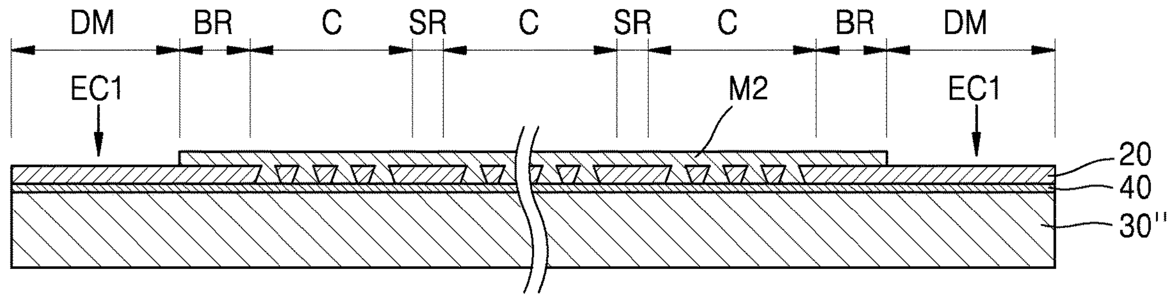

Next, referring to FIG. 10, a patterned insulating portion M2 may be formed on at least a plurality of cell portions C. The insulating portion M2 may be formed on the separation portions SR and the outer peripheral portion BR around the plurality of cell portions C. The insulating portion M2 may be formed of the same material by the same method as the insulating portion M1, and may be preferably a photoresist.

Then, an exposed portion of the mask 20 on which the insulating portion M2 is not formed may be subjected to etching EC1. The etching EC1 may be performed on a first surface (upper surface) of the support 30" to which the mask 20 adheres. The exposed portion of the mask 20 on which the insulating portion M2 is not formed may be subjected to etching EC1. A portion of the mask 20 that corresponds to the dummy portion DM may be subjected to etching EC1. At least the plurality of cell portions C of the mask 20 are not subjected to etching EC1. Preferably, the plurality of cell portions C, the separation portions SR, and the outer peripheral portion BR may not be subjected to etching EC1.

The portion of the connection portion 40 that corresponds to the dummy portion DM of the mask 20 may be subjected to etching EC1 simultaneously or sequentially with the etching EC1 of the mask 20.

Figure 11:
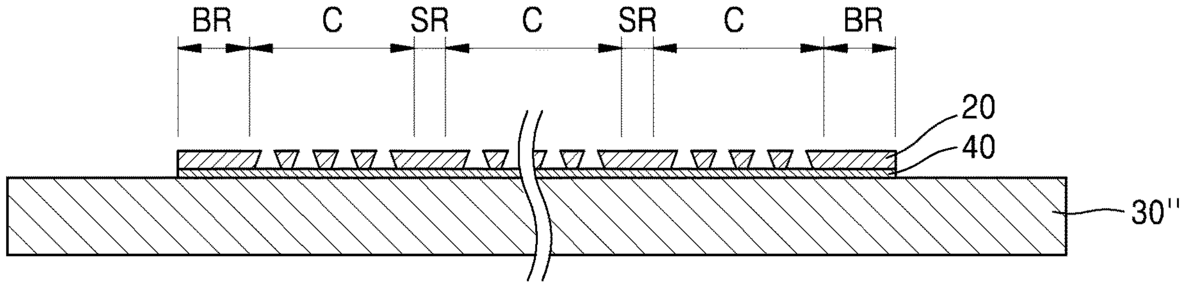

Thereafter, referring to FIG. 11, the insulating portion M2 may be removed. The dummy portion DM of the mask 20 may be removed by etching EC1, and a region of the first surface of the support 30" that corresponds to the dummy portion DM may be exposed.

Figure 12:
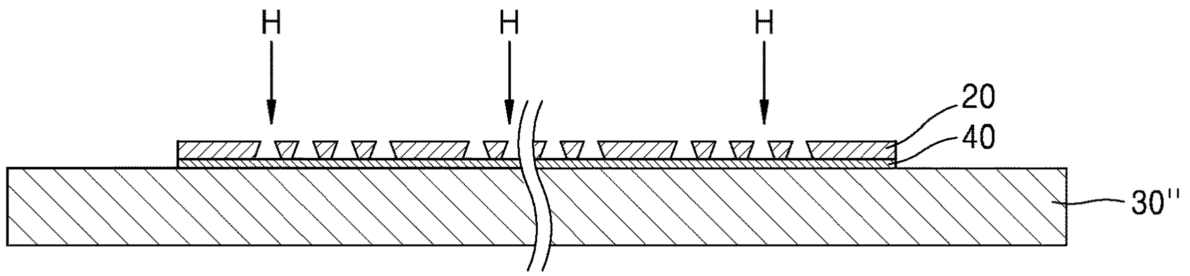

Then, referring to FIG. 12, the mask 20 and the support 30" may be subjected to heat treatment H. The connection portion 40 may also be subjected to heat treatment H. The heat treatment may be performed at a temperature ranging from 300° C. to 800° C.

Meanwhile, the heat treatment may be performed in advance other than in the process shown in FIG. 12. As shown in FIGS. 6, 8, and 9, after electroforming the mask 20, heat treatment H may be performed before etching. In this case, after the heat treatment H, the insulating portion M2 may be formed and etching EC1 may be performed.

Generally, an Invar thin plate produced by electroforming has a higher coefficient of thermal expansion as compared to an Invar thin plate produced by rolling. Thus, by performing heat treatment on the Invar thin plate, the coefficient of thermal expansion can be lowered. In this heat treatment, slight deformation may occur in the Invar thin plate. If heat treatment is performed only on the mask 20 that exists separately, the mask 20 may be warped as a whole or slight deformation may occur in the mask patterns P. Therefore, when heat treatment is performed in a state where the support 30" and the mask 20 are fixed and adhered to each other, such a deformation may be prevented.

In addition, the coefficient of thermal expansion of the Invar thin plate produced by electroforming and the coefficient of thermal expansion of the silicon wafer are approximately 3 to 4 ppi, which are nearly the same as each other. Thus, even when the heat treatment H is performed, since the degree of thermal expansion of the mask 20 and the degree of thermal expansion of the support 30" are the same, there is no misalignment due to thermal expansion and the minute deformation of the mask pattern P can be prevented.

In addition, the present invention is characterized in that the mask 20 and the support 30" are adhered to each other by the heat treatment H. In the process of heat treatment H, the connection portion 40 between the mask 20 and the support 30", which is melted into liquid phase and then solidified again, may mediate adhesion between the mask 20 and the support 30". The connection portion 40 may act as an adhesion layer or a glue layer. In the embodiment of FIGS. 7 and 8, the first mask layer 21 may serve as the connection portion 40.

Meanwhile, when the mask 20 is directly electroformed on the support 30" rather than forming the separate connection portion 40 as shown in FIG. 5, the connection portion 40 may be produced on the interface therebetween during the heat treatment H. In this case, the connection portion 40 may be provided as an intermetallic compound in which the component of the mask 20 and the component of the support 30 are combined. As the Fe and Ni components of the mask 20 and the Si component of the support 30" are combined, the connection portion 40 may contain Ni and Si, or Fe, Ni, and Si, or may be provided as a silicide containing Fe and Ni. By the bond strength of the intermetallic compound, the mask 20 and the support 30" may be attached to each other with the connection portion 40 interposed therebetween.

According to one embodiment, the following electroforming pre-treatment/electroforming conditions are required as formation conditions of the connection portion 40 provided as a silicide. First, the mask 20 may be electroformed on the support 30" that has been highly doped at a concentration higher than or equal to $10^{19}$ $cm^{-3}$ and has a surface resistance of approximately $5\times10^{-4}$ to $1\times10^{-2}$ ohm·cm. Second, prior to the electroforming of the mask 20, the surface of the support 30" made of a silicon wafer material may be subjected to HF treatment to form a Si surface in which SiO is controlled. Third, the formation of Ni-silicide may be promoted by forming Ni-rich Fe—Ni at the beginning and controlling the composition so that Ni content is 35 to 45%. Alternatively, prior to the electroforming of the mask 20 containing Fe—Ni components, a first mask layer made of Ni, Co, Ti, etc. May be added as a glue layer to promote the formation of a silicide.

Also, according to one embodiment, the heat treatment H may be performed at a temperature ranging from 300° C. to 800° C., and may proceed in a number of steps. As 2-step heat treatment, after forming Ni2Si at a low temperature range (approximately 250 to 350° C.) to adhere the mask 20 onto the support 30", heat treatment may be carried out by gradually raising the temperature to a high temperature range (approximately 450 to 650° C.). In the case of an Invar mask produced by electroforming, since it has a microcrystal and/or amorphous structure, when the temperature is rapidly raised during the heat treatment, the Invar mask may be detached or separated from the silicon wafer support due to volume shrinkage. Therefore, it is preferable to perform heat treatment by gradually raising the temperature to high temperature after adhering the Invar mask to the silicon wafer support 30 at low temperature.

In addition, according to one embodiment, a reducing atmosphere should be maintained during the heat treatment H. The reducing atmosphere may be formed as $H_2$, Ar, or $N_2$ atmosphere, and may preferably use a dry $N_2$ gas to prevent oxidation of the Invar mask. In order to prevent oxidation of the Invar mask, it is necessary to manage the $O_2$ concentration to be less than 100 ppm. Alternatively, a vacuum atmosphere of $<10^{-2}$ torr may be formed. The heat treatment may be performed for 30 minutes to 2 hours.

Meanwhile, to control the reaction of Ni and Fe—Ni with Si during the heat treatment H, a barrier film (not shown) may be formed on the support 30" prior to the electroforming of the mask 20 on the support 30". The barrier film may prevent the components (e.g., Ni and Fe—Ni) of the plated film of the mask 20 from permeating uncontrollably into the silicon support 30". Also, the barrier film preferably has conductivity so that electroforming can be performed on the surface thereof. Taking this into account, the barrier film may include a material, such as titanium nitride (TiN), titanium/titanium nitride (Ti/TiN), tungsten carbide (WC), titanium tungsten (WTi), graphene, or the like. A thin film formation process such as deposition of a barrier film may be used without limitations. The barrier film may control the reaction of Fe and Ni with Si so that a uniform silicide can be formed and the mask 20 and the connection portion 40 can be attached to each other with appropriate adherence strength. In addition, the barrier film may be configured as a film or a combination of films capable of providing predetermined adhesion or adherence so that the mask 20 is not separated from the support 30" in a state in which the mask 20 is electroformed on the support 30".

The thickness of the connection portion 40 (silicide thickness) may be controlled to 10 to 300 nm by adjusting the temperature and time to form adhesion between the support 30" and the mask 20.

Figure 13:
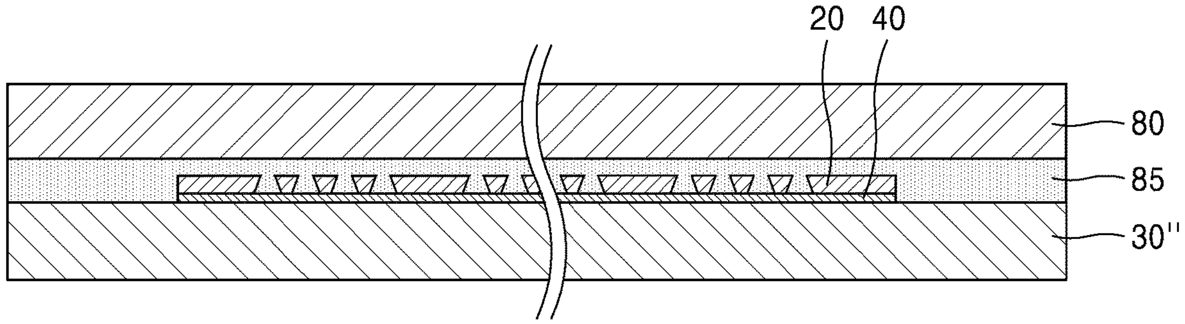

Then, referring to FIG. 13, a template 80 may be adhered onto the mask 20 and the support 30". The template 80 is a medium by which the mask 20 can be moved while being adhered to and supported by one surface thereof. The template 80 may have a flat plate shape with the same or greater area than the mask 20 such that the mask 20 can be entirely supported, and preferably has a circular shape corresponding to the shape of the support 30".

A material such as a wafer, glass, silica, quartz, alumina ($Al_2O_3$), borosilicate glass, or zirconia may be used for the template 80.

The template 30 may be adhered to the mask 20 with a temporary adhering portion 85 interposed therebetween. The temporary adhering portion 85 may be formed on one surface of the template 80 or the mask 20. The temporary adhering portion 85 may allow the mask 20/the support 30" to be temporarily adhered to one surface of the template 80 and supported on the template 80 until the thickness of the support 30" is reduced (see FIG. 14) and an etching process EC2 is performed (see FIG. 16).

As the temporary adhering portion 85, a liquid wax, an adhesive, or an adhesive sheet that can be separated by any one of heat application, chemical treatment, UV application, or ultrasonic application may be used.

For example, a liquid wax may be used as the temporary adhering portion 85. The liquid wax may be the same as the wax used in the polishing process of a semiconductor wafer, and the type thereof is not particularly limited. The liquid wax may contain a material, such as acrylic, vinyl acetate, nylon, or various polymers, as a resin component for controlling the adhesion holding power, impact resistance, and the like, and a solvent. For example, the temporary adhering portion 85 may contain acrylonitrile butadiene rubber (ABR) as a resin component, and SKYLIQUID ABR-4016 containing n-propyl alcohol as a solvent component. The liquid wax may be formed using spin coating.

The temporary adhering portion 85, which is a liquid wax, may have low viscosity at a temperature higher than 85° C.~100° C., and may have increased viscosity and be partially solidified at a temperature lower than 85° C., allowing the mask 20 and the template 80 to be fixed and adhered to each other.

The temporary adhering portion 85 may be filled in at least a portion between the mask 20 and the mask patterns P. Accordingly, the mask 20/the support 30" are allowed to be more strongly adhered to and supported by the template 80, and deformation may be effectively prevented in a thickness reduction process TN of the support 30", which will be described below.

Figure 14:
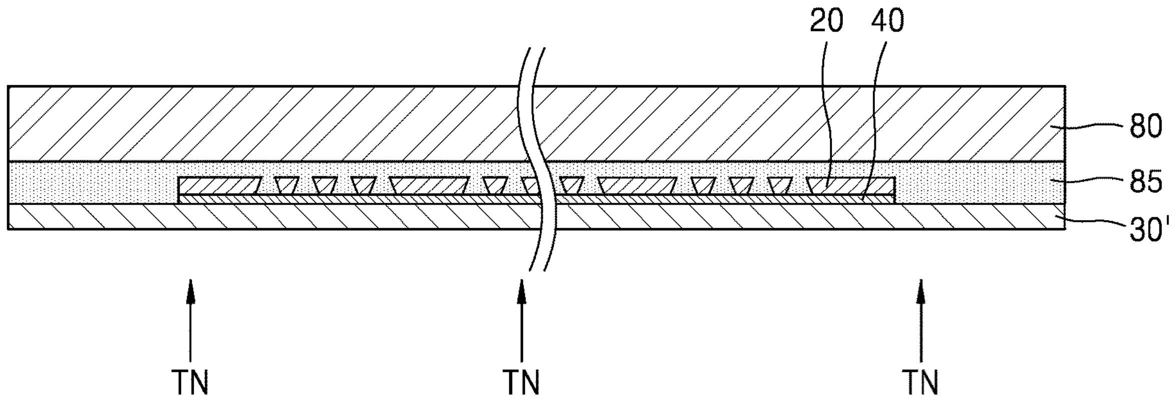

Then, referring to FIG. 14, after the mask 20/the support 30" is adhered onto the template 80, the thickness reduction process TN of the support 30" (or the conductive substrate 30") may be performed. The thickness reduction process TN may be performed on a lower surface (second surface) that is opposite to the upper surface (first surface) of the support 30" in contact with the mask 20. The thickness reduction process TN may be performed using lapping, polishing, buffing, etc.

When an OLED deposition process is performed (see FIG. 18), the mask-support assembly 100 may be brought in contact with or very close to a target substrate 1900 due to the magnetic field applied by a magnet 1310. To this end, a magnetic material may be connected to a lower portion or one side of the mask-support assembly 100. Thus, in order to sufficiently transmit a contact force according to the application of the magnetic field to the mask 20 and the support 30, the thickness of the mask 20/the support 30 should be thin. Alternatively, in order to adjust PPA by applying a predetermined tensile force to the mask-support assembly 100, the thickness of the support 30 needs to be thin. In addition, the thickness of the support 30 needs to be appropriately reduced such that it has sufficient rigidity to support the mask 20 and can be tensioned on a cell portion-by-cell portion basis. The thickness of the mask 20 is approximately 2 μm to 12 μm, which is sufficiently thin, and thus it is necessary to further reduce the thickness of the support 30". For example, the support 30" (or the conductive substrate 30"), which is a silicon wafer, has a thickness of approximately 725 μm, and hence its thickness needs to be reduced. Taking this into account, the thickness of the support (30"→30') after the thickness reduction process TN may become approximately 50 μm to 200 μm.

If the thickness reduction process TN of the support 30" is directly performed, the support 30" becomes thin and its rigidity is lowered, which may cause twisting or warpage. However, according to the present invention, the template 80 adheres to and supports the mask 20/the support 30", and thus deformation of the support 30" may be prevented during the thickness reduction process TN.

The mask 20/the support 30" may not be adhered to and supported by the template 80 made of wafer, glass, or the like and having a plate shape, and the thickness reduction process TN may be performed after the mask 20/the support 30" is fixed to a holder (not shown), a gripper (not shown), or the like. Alternatively, the support 30' (or the conductive substrate 30') whose thickness has been reduced before the electroforming of the mask 20 may be used.

Figure 15:
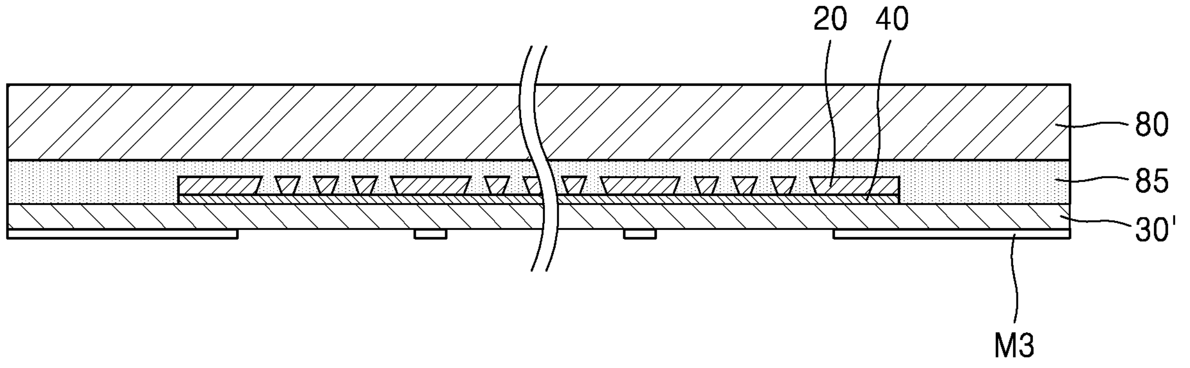

Then, referring to FIG. 15, in order to impart etch resistance, an insulating portion M3 may be formed on the lower surface of the support 30' except for a portion that corresponds to the cell portion C. The insulating portion M3 may be formed of photoresist using a printing method or the like, and may be formed of silicon oxide or silicon nitride serving as a hard mask by a method such as thermal oxidation or thermal nitridation. Meanwhile, a metal may be used as a mask for etching.

Figure 16:
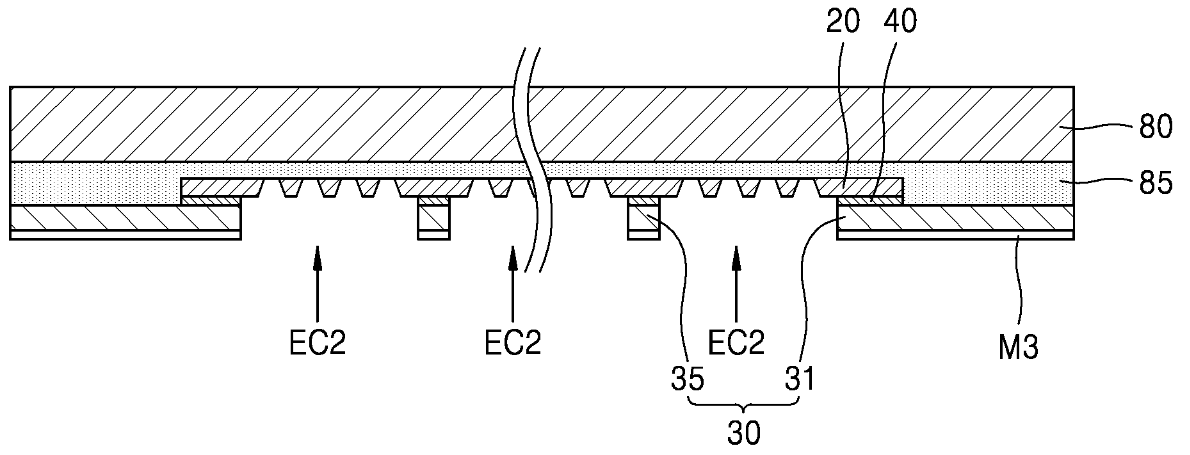

Then, referring to FIG. 16, the support 30' (or the conductive substrate 30') may be subjected to etching EC2. The etching EC2 may be performed on the second surface (lower surface) that is opposite to the first surface (upper surface) of the support 30' to which the mask 30 adheres. A portion exposed on the lower surface of the support 30' that is not covered by the insulating portion M2 may be subjected to etching EC2. A region of the support 30' that corresponds to the cell portion C of the mask 20 may be subjected to etching EC. Regions that correspond to the separation portion SR and the outer peripheral portion BR of the mask 30 are not subjected to etching.

The support 30 which has been subjected to etching EC2 may have a shape including the edge portion 31 and the first and second grid portions 33 and 35. The portion of the connection portion 40 other than the portions that corresponds to the edge portion 31 and the grid portions 33 and 35 of the support 30 may be subjected to etching EC2 simultaneously or sequentially with the etching EC2 of the support 30.

The template 80 may adhere to and support the mask 20/the support 30 and prevent the support 30 from deforming during the etching process EC, or when an empty area, such as the cell regions CR (see FIG. 4), increases while only the edge portion 31 and grid portions 33 and 35 remain on the support 30 after the etching EC process. Also, the template 80 may protect the surface of the mask 20 during the etching EC2 process.

The etching EC2 may use a dry etching method having anisotropic etching characteristics so that the edge portion 31 and the grid portions 33 and 35 clearly appear on the support 30. Since the support 30' (or the conductive substrate 30') is a silicon wafer, there is an advantage in that etching EC2 may be performed by utilizing existing semiconductor-related technologies and micro-electro mechanical system-related technologies.

Meanwhile, the etching EC2 process shown in FIG. 16 may employ wet etching rather than dry etching. Since wet etching has isotropic etching characteristics, undercut may occur in the insulating portion M3 on the second surface (lower surface) of the support 30'. Also, due to the isotropic etching characteristics, side surfaces of the edge portion 31 and the first and second grid portions 33 and 35 may be formed to be tapered. In this case, since organic material sources 1600 can move at an inclined angle along the tapered side surface. Thus, shadow effect may be primarily prevented in the support 30 and then secondarily prevented in the tapered mask patterns P.

According to one embodiment, etching EC may be performed by dipping the laminate of the mask 20/the support 30' in an etchant for Si wet etching. As a Si etchant, a solution containing 1 to 25% of KOH or NaOH in ultrapure water may be used. Alternatively, a solution containing 1 to 25% of TMAH in ultrapure water may be used. The temperature at which the etching process is performed may range from room temperature to 80° C.

Only a region opened by a hard mask of PR, SiN, or SiO is silicon etched, such that an end point of etching may be formed at an interface between the mask 20 and the support 30'. That is, only the silicon wafer may be etched (EC) and the mask 20 may not be etched.

In addition, when Si etching is performed by selecting the orientation of the silicon wafer, anisotropic etching is possible, so that the above-described edge portion 31 and the taper inclination angles of the side surfaces of the first and second grid portions 33 and 35 can be adjusted.

In addition, according to one embodiment, in the case of a OH-based etchant in Si wet etching, it is difficult to use an insulating portion M3 made of a general PR material. Thus, when using a OH-based etchant, the insulating portion M3 may employ an epoxy-based PR, or nitride or oxide-based (such as SiN, SiO, or the like) hard mask.

Further, the etching rate of wet etching may significantly vary depending on the crystal orientation of the silicon support 30'. For example, the (100) and (110) planes have a high etching rate for wet etching, whereas the (111) plane has a low etching rate. Accordingly, in the present invention, wet etching and dry etching may be alternately performed to etch (EC) the portion exposed on the lower surface of the support 30'.

Wet etching has the characteristics of low cost and high productivity, but has a low etching rate on a specific plane, and dry etching has the advantage of the same etching rate in all planes but has the characteristics of high cost and low productivity. Thus, when only the dry etching is performed, there is a risk of exceeding the operating limits of an etching apparatus. Therefore, when the (100) and (110) planes are exposed on the lower surface of the support 30', wet etching may be performed. When the (111) plane is exposed during the wet etching, the (111) plane may be first removed by dry etching, and then wet etching may be performed again.

Then, a process of separating the template 80 from the mask 20 (or the mask-support assembly 100) may be further performed. The template 80 may be separated from the mask 20 (or the mask-support assembly 100) by applying at least one of heat, chemical treatment, ultrasound waves, or UV light to the temporary adhering portion 85. For example, when heat with a temperature higher than 85° C. (or 100° C.) is applied, the viscosity of the temporary adhering portion 85 is lowered and the adhesion between the template 80 and the mask 20 is reduced so that the template 80 can be separated from the mask 20. In another example, the template 80 may be separated by dissolving or removing the temporary adhering portion 85 through immersion in a chemical substance, such as IPA, acetone, ethanol, or the like. In another example, the template 80 may be separated by weakening the adhesion between the template 80 and the mask through applying ultrasound waves or UV light.

Also, the insulating portion M3 may be removed. Then, when a subsequent treatment process, such as cleaning, is completed, the mask-support assembly 100 as shown in FIGS. 1 and 2 may be provided. The connection portion 40 may remain interposed between the mask 20 and the support 30.

Figure 17:
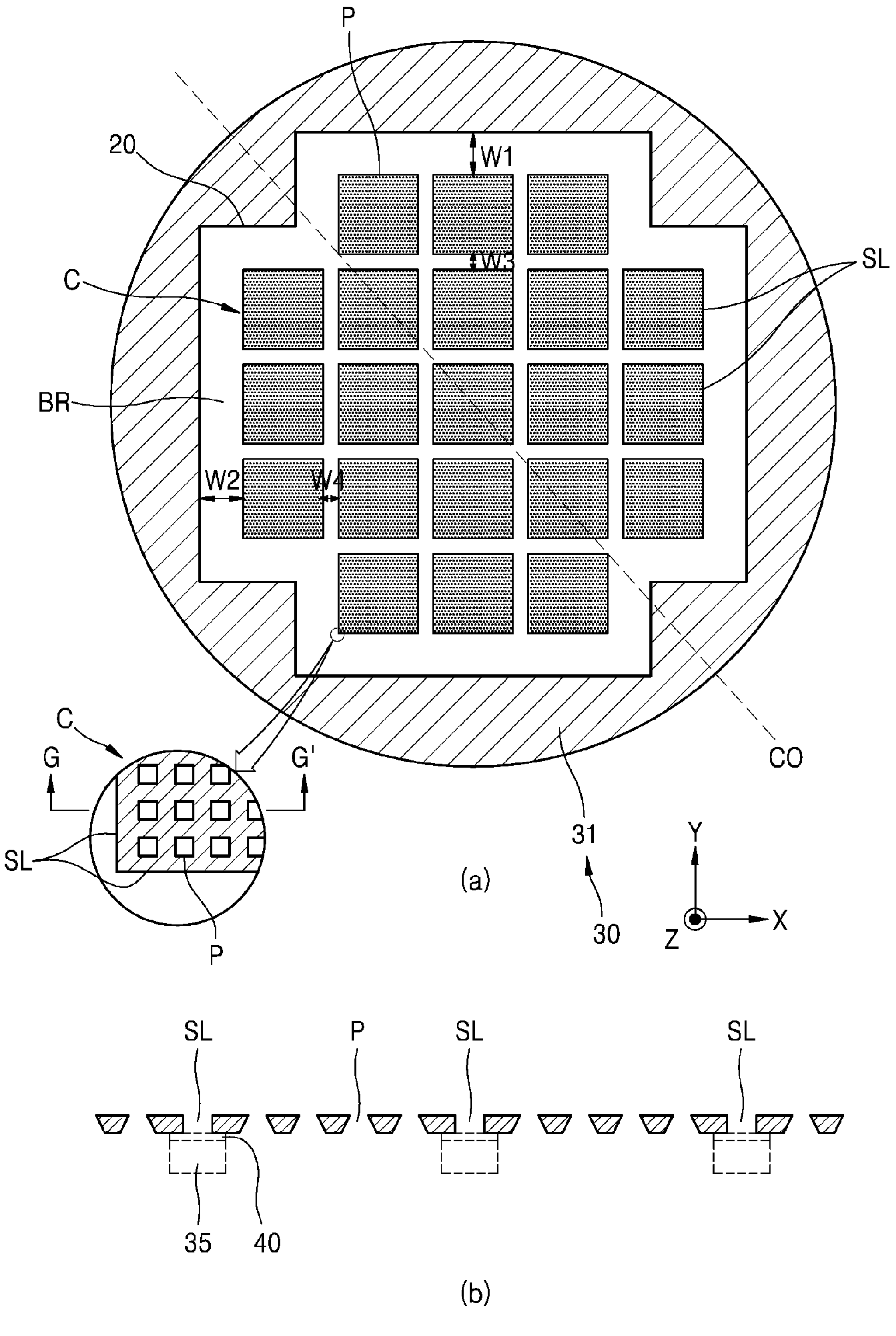
FIG. 17 is a schematic plan view and a schematic cross-sectional view taken along line G-G' showing a mask according to another embodiment of the present invention.

FIG. 17 is a schematic plan view (a) and a schematic cross-sectional view (b) taken along line G-G' showing a mask according to another embodiment of the present invention.

Referring to FIG. 17, a mask 20 may include a plurality of cell portions C that include a plurality of mask patterns P. In addition, slit lines SL may be formed between each cell portion C. The cell portions C may be spaced apart from each other by the slit lines SL. In addition, one side of each of neighboring cell portions C in each pair may be supported on the same grid portion 35 (and the connection portion 40). Referring to (b) of FIG. 17, it can be seen that the right side and the left side of two neighboring cell portions C are supported on a second grid portion 35 represented by a dotted line.

Unlike the mask 20 in which the cell portions C are connected to each other through the separation portions SR as shown in FIGS. 2 and 3, the cell portions C of the mask 20 of FIG. 17 may be spaced apart from each other by the slit lines SL. Accordingly, the mask 20 may include the plurality of cell portions C and an outer peripheral portion BR, or include only the plurality of cell portions C. The surface of the underlying support 30 (an edge portion 31 and the first and second grid portions 33 and 35) may be exposed between the cell portions C by the slit lines SL. As the cell portions C exist independently of each other by the slit lines SL without being connected to each other, it is possible to control the cell portions C, such as applying tension to each cell portion C or connecting each cell portion C to a different object. In addition, the slit lines SL allows a residual stress to be present only in each cell portion C and is prevented from affecting other cell portions C.

FIG. 18 is a schematic diagram showing an OLED pixel deposition apparatus 1000 to which a mask-support assembly 10 according to one embodiment of the present invention is applied.

Referring to FIG. 18, the OLED pixel deposition apparatus 1000 includes a magnet plate 1300 in which a magnet 1310 is accommodated and a cooling water line 1350 is disposed, and a deposition source supply 1500 configured to supply organic material sources 1600 from a lower portion of the magnet plate 1300.

A target substrate 1900, such as glass, on which the organic material sources 1600 are to be deposited may be interposed between the magnet plate 1300 and the deposition source supply 1500. The mask-support assembly 100 for enabling deposition of the organic material source 1600 per pixel may be positioned in contact with or very close to the target substrate 1900. The magnet 1310 may generate a magnetic field and the mask-support assembly 100 is brought in contact with or very close to the target substrate 1900 due to the attractive force caused by the magnetic field.

The deposition source supply 1500 may supply the organic material sources 1600 while horizontally reciprocating, and the organic material sources 1600 supplied from the deposition source supply 1500 may pass through mask patterns P formed on the mask-support assembly 100 and be deposited on one side of the target substrate 1900. The organic material sources 1600 deposited through the mask patterns P of the mask-support assembly 100 may serve as pixels 1700 of an OLED.

Since the mask pattern P is formed to have sloped sides (formed in a tapered shape), the organic material sources 1600 pass through the mask patterns P along the sloped direction and thus non-uniform deposition of the OLED pixels 1700 due to shadow effect may be prevented.

Figure 19:
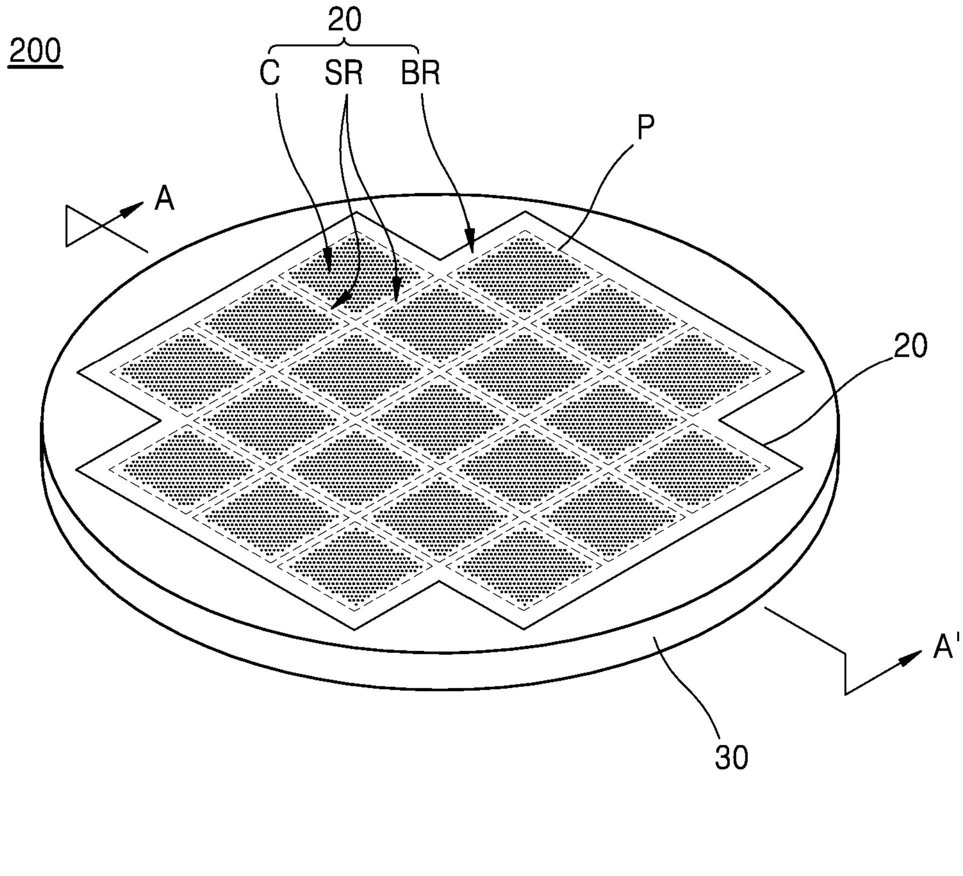
FIG. 19 is a schematic view of a mask-support assembly according to another embodiment of the present invention.
Figure 20:
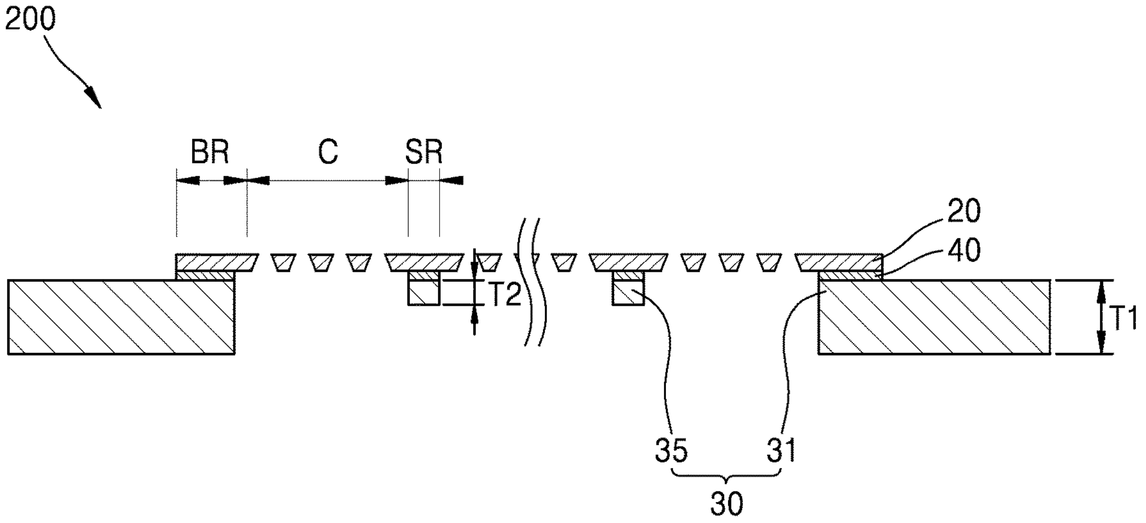
FIG. 20 is a schematic cross-sectional view taken along line A-A' of FIG. 19.

FIG. 19 is a schematic diagram illustrating a mask-support assembly 200 according to another embodiment of the present invention. FIG. 20 is a schematic cross-sectional view taken along line A-A' of FIG. 19. Hereinafter, only differences from the mask-support assembly 100 described with reference to FIGS. 1 to 4 will be described and detailed descriptions of the mask 20, the connection portion 40, and the like, which are the same configurations as those in the mask-support assembly 100 will not be reiterated.

Referring to FIGS. 19 and 20, in a mask-support assembly 200 according to another embodiment, a thickness T1 of an edge portion 31 of a support 30 may be thicker than a thickness T2 of a first grid portion 33/a second grid portion 35.

The edge portion 31 may serve as a frame in the mask-support assembly 200 and may have the thickness T1 that is thicker than that of the first and second grid portions 33 and 35 in order to prevent the support 30 from deforming or warping as a whole while having sufficient rigidity to support the mask 20. For example, the thickness T1 of the edge portion 31 may range from approximately 700 μm to 1,000 μm when a silicon wafer is directly applied, and approximately 500 μm to 1,000 μm when a predetermined thickness reduction is applied.

It may be preferable that the thickness T2 of the first and second grid portions 33 and 35 is thicker than the thickness of the mask 20 and thinner than the edge portion 31 because the first and second grid portions 33 and 35 should be provided with the cell regions CR (see FIG. 4) therebetween, through which an organic material 1600 passes, while supporting at least the mask 20 and the organic material 1600 should not cause shadow effect due to the thickness T2 of the first and second grid portions 33 and 35. For example, the thickness T2 of the first and second grid portions 33 and 35 may be approximately 50 μm to 200 μm.

Figure 21:
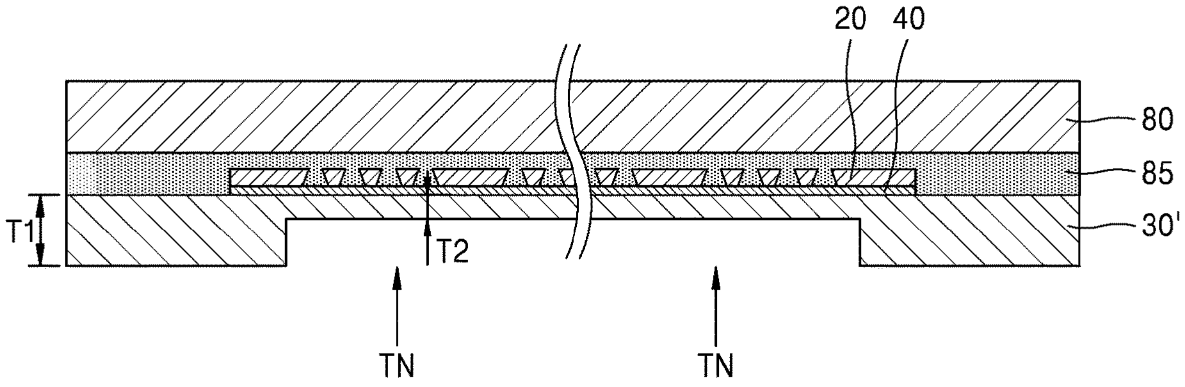
FIGS. 21 to 23 are schematic views illustrating a producing process of a mask-support assembly according to another embodiment of the present invention.
Figure 22:
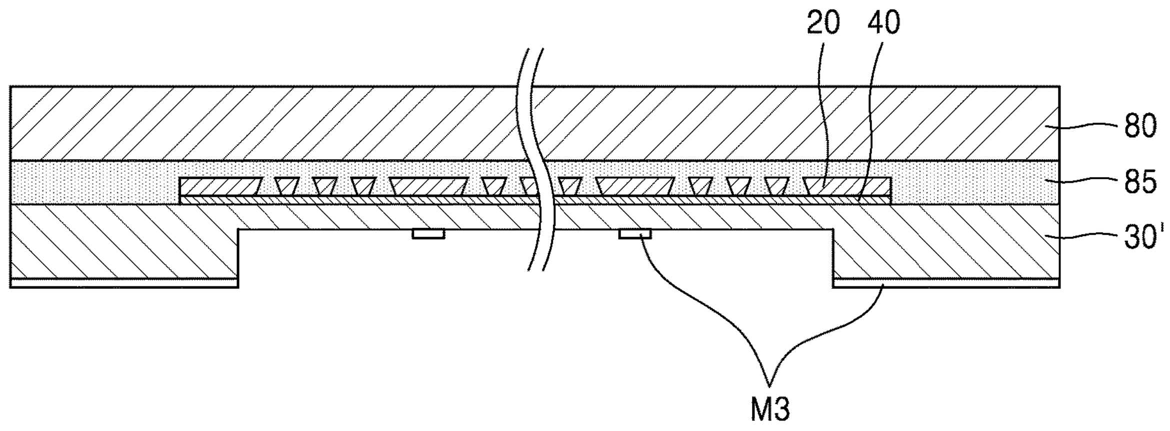
Figure 23:
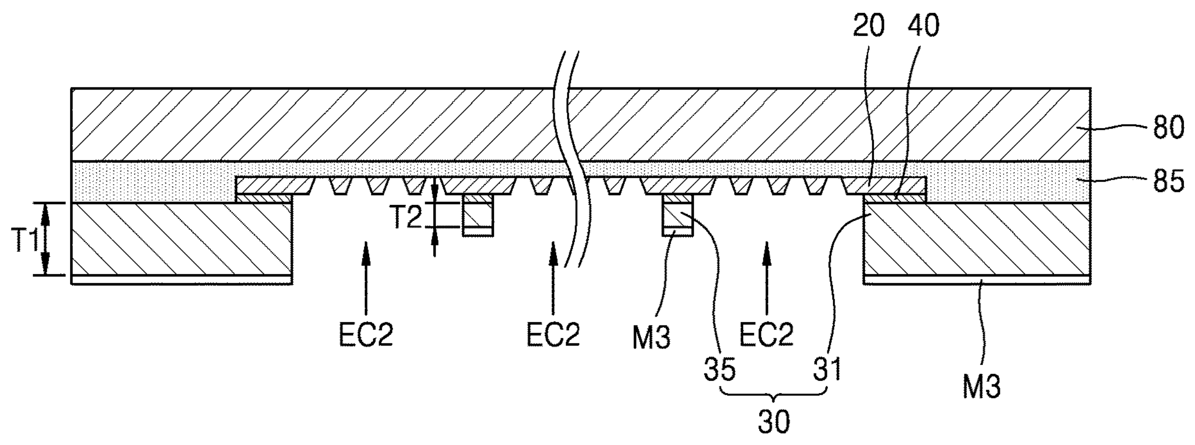

FIGS. 21 to 23 are schematic views illustrating a producing process of the mask-support assembly 200 according to another embodiment of the present invention.

The processes preceding the process shown in FIG. 21 are the same as those shown in FIGS. 5 to 13. Then, referring to FIG. 21, after a mask 20/a support 30" is adhered onto the template 80, a thickness reduction process TN of the support 30" (or a conductive substrate 30") may be performed. The thickness reduction process TN may be performed on a lower surface (second surface) that is opposite to the upper surface (first surface) of the support 30" in contact with the mask 20. The thickness reduction process TN may be performed using lapping, polishing, buffing, etc.

The thickness reduction process TN may be performed on a central part of the support 30". The thickness reduction process TN may be performed on a region of the support 30" that corresponds to a region where cell portions C of the mask 20 are disposed. Alternatively, the thickness reduction process TN may be performed on a region where the first and second grid portions 33 and 35 are to be formed, and may not be performed on a region where the edge portion 31 is to be formed. The region where the first and second grid portions 33 and 35 are to be formed may even include regions that correspond to at least a part of the cell portions C, the separation portions SR, and the outer peripheral portion BR of the mask 20.

On the other hand, the thickness reduction process TN may be divided into stages, wherein a primary thickness reduction process may be performed over the entire lower surface (second surface) of the support 30" and then a secondary thickness reduction process may be performed on the region where the first and second grid portions 33 and 35 are to be formed.

Accordingly, in the support 30' subjected to the thickness reduction process TN, the thickness T2 of the grid portions 33 and 35 is thinner than the thickness T1 of the edge portion 31, and at least steps may be formed between the grid portions 33 and 35 and the edge portion 31.

The thickness of the support 30 needs to be appropriately reduced such that it has sufficient rigidity to support the mask 20 and can be tensioned on a cell portion-by-cell portion basis. The edge portion 31 of the support 30 may be formed to be thick enough to have sufficient rigidity to support the mask 20, and the grid portions 33 and 35 need to be controlled to support the mask 20 without causing shadow effect. For example, the support 30" (or the conductive substrate 30"), which is a silicon wafer, has a thickness of approximately 725 μm, and hence its thickness needs to be reduced. Taking this into account, the thickness of the central part of the support (30"→30') after the thickness reduction process TN may become approximately 50 μm to 200 μm.

If the thickness reduction process TN of the support 30" is directly performed, the support 30" becomes thin and its rigidity is lowered, which may cause twisting or warpage. However, according to the present invention, the template 80 adheres to and supports the mask 20/the support 30", and thus deformation of the support 30" may be prevented during the thickness reduction process TN.

Then, referring to FIG. 22, in order to impart etch resistance, an insulating portion M3 may be formed on the lower surface of the support 30' except for a portion that corresponds to the cell portion C. Alternatively, the insulating portion M3 may be formed on the lower surface of the edge portion 31. The insulating portion M3 may be formed of photoresist using a printing method or the like, and may be formed of silicon oxide or silicon nitride serving as a hard mask by a method such as thermal oxidation or thermal nitridation. Meanwhile, a metal may be used as a mask for etching.

Then, referring to FIG. 23, the support 30' (or the conductive substrate 30') may be subjected to etching EC2. The etching EC2 may be performed on the second surface (lower surface) that is opposite to the first surface (upper surface) of the support 30' to which the mask 30 adheres. A portion exposed on the lower surface of the support 30' that is not covered by the insulating portion M2 may be subjected to etching EC2. A region of the support 30' that corresponds to the cell portion C of the mask 20 may be subjected to etching EC. Regions that correspond to the separation portion SR and the outer peripheral portion BR of the mask 30 are not subjected to etching.

The support 30 which has been subjected to etching EC2 may have a shape including the edge portion 31 and the first and second grid portions 33 and 35.

Figure 24:
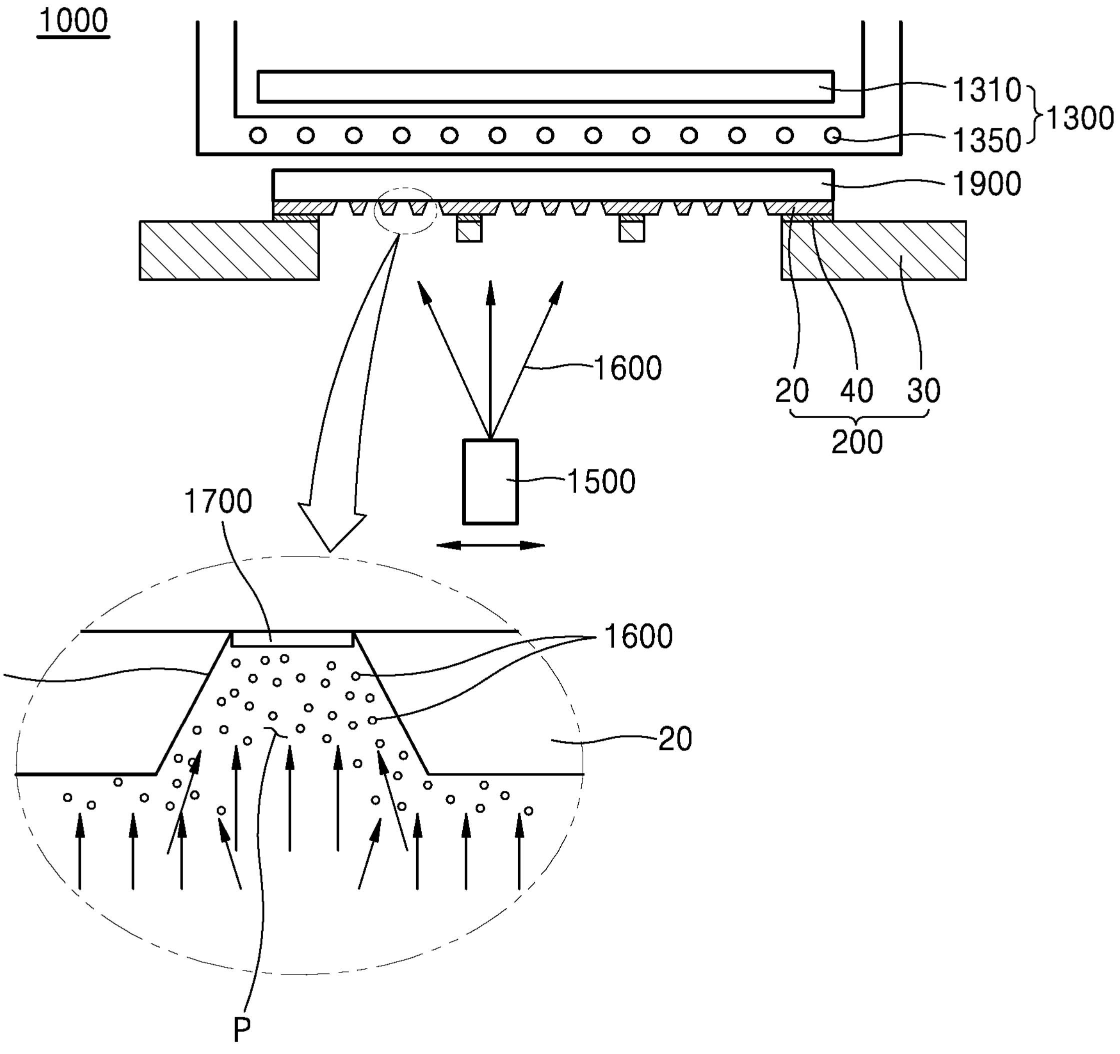
FIG. 24 is a schematic diagram of an OLED pixel deposition apparatus to which a mask-support assembly according to another embodiment of the present invention is applied.

FIG. 24 is a schematic diagram showing an OLED pixel deposition apparatus 1000 to which a mask-support assembly 200 according to another embodiment of the present invention is applied. Hereinafter, only differences from the OLED pixel deposition apparatus 100 described above with reference to FIG. 18 will be described.

A magnet 1310 of a magnet plate 1300 may generate a magnetic field and the mask-support assembly 200 is brought in contact with or very close to a target substrate 1900 due to the attractive force caused by the magnetic field. In the mask-support assembly 200, a thickness T1 of an edge portion 31 is thicker than a thickness T2 of a first grid portion 33/a second grid portion 35, and thus the edge portion 31 may be in more close contact with the target substrate 1900 while supporting the mask 20 with strong rigidity. Since the thickness T1 of the edge portion 31 is thick, a greater attractive force due to the magnetic field acts on the edge portion 31, enabling the mask-support assembly 200 to be in close contact with the target substrate 1900 with increased contact force.

Organic material sources 1600 supplied from a deposition source supply 1500 may pass through a mask pattern P formed on the mask-support assembly 100 and be deposited on one side of the target substrate 1900. The organic material sources 1600 deposited through the mask patterns of the mask-support assembly 100 may serve as pixels 1700 of an OLED.

As described above, a frame is formed by processing and connecting the support 30 to the mask 20 in a state in which a separate physical tension is not applied to the mask 20 after forming the mask 20 on the support 30 through electroforming. Thus, there is no risk of misalignment of the mask. Accordingly, the mask is clearly aligned so that stability of pixel deposition can be improved and at the same time an ultra-high resolution of 2,000 PPI or higher can be realized.

According to the present invention with the above-described configuration, it is possible to realize ultra-high-resolution pixels of a microdisplay.

In addition, according to the present invention, it is possible to improve stability of pixel deposition by allowing a mask to be clearly aligned.

In addition, according to the present invention, it is possible to allow all parts of a mask to have uniform stress levels.

However, the scope of the present invention is not limited by the above effects.

While the present invention has been particularly shown and described with reference to embodiments thereof, it will be understood by one of ordinary skill in the art that various changes in form and details may be made therein without departing from the scope of the present invention as defined by the following claims.

REFERENCE NUMERALS

20: MASK
21, 25: FIRST AND SECOND MASK LAYERS
30: SUPPORT
31: EDGE PORTION
33, 35: FIRST AND SECOND GRID PORTIONS
40: CONNECTION PORTION
80: TEMPLATE
100, 200: MASK-SUPPORT ASSEMBLY
1000: OLED PIXEL DEPOSITION APPARATUS
C, SR, DM: CELL PORTION, SEPARATION PORTION, DUMMY PORTION
P: MASK PATTERN
SL: SLIT LINE

What is claimed is:

1. A mask-support assembly comprising:
a support comprising an edge portion and a grid portion; and
a mask connected onto the support and comprising a plurality of cell portions in each of which a mask pattern is formed,
wherein an edge of the support has a circular shape,
wherein the grid portion comprises:
a plurality of first grid portions extending in a first direction and having both ends connected to the edge portion; and
a plurality of second grid portions extending in a second direction perpendicular to the first direction, intersecting with the plurality of first grid portions, and having both ends connected to the edge portion,
wherein the mask further comprises:
separation portions disposed between the plurality of cell portions; and
an outer peripheral portion disposed on an outer edge of the plurality of cell portions, and
wherein a region of the support corresponding to an outside of the outer peripheral portion of the mask is exposed on one surface of the support.

2. The mask-support assembly of claim 1,
wherein the support and the mask are connected through a connection portion interposed therebetween and the connection portion comprises at least one of Ni, Cu, Ti, Au, Ag, Al, Sn, In, Bi, Zn, Sb, Ge, or Cd.

3. The mask-support assembly of claim 1,
wherein at least a region that corresponds to the edge portion of the support is exposed.

4. The mask-support assembly of claim 1,
wherein the plurality of cell portions have a rectangular shape and the separation portions and the outer peripheral portion are formed along the first direction and the second direction perpendicular to the first direction.

5. The mask-support assembly of claim 4,
wherein a width of the outer peripheral portion is wider than that of the separation portions.

6. The mask-support assembly of claim 1,
wherein the mask comprises a first mask layer and a second mask layer that is formed of a material different from that of the first mask layer, the first mask layer is made of a material including at least one of Ni, Cu, Au, Ag, Al, Co, Ti, Cr, W, or Mo, and the second mask layer is made of Invar or Super Invar.

7. The mask-support assembly of claim 1,
wherein the support is formed from a silicon wafer and the mask is formed on the silicon wafer by electroforming.

8. The mask-support assembly of claim 7,
wherein the surface resistance of the support is $5\times10^{-4}$ to $1\times10^{-2}$ ohm·cm.

9. The mask-support assembly of claim 7,
wherein a crystal orientation of a (100) plane or (111) plane of the silicon wafer is not parallel to a formation direction of the grid portion.

10. The mask-support assembly of claim 1,
wherein slit lines are formed between each cell portion so that the plurality of cell portions are spaced apart from each other.

11. The mask-support assembly of claim 1,
wherein a thickness of the grid portion is thinner than that of the edge portion, a thickness of the edge portion ranges from 500 μm to 1,000 μm, and a thickness of the grid portion ranges from 50 μm to 200 μm.

* * * * *